United States Patent [19]
Osanai et al.

[11] Patent Number: 5,909,272
[45] Date of Patent: *Jun. 1, 1999

[54] STAGE AND EXPOSURE APPARATUS USING SAME

[75] Inventors: Eiji Osanai, Yokohama; Mitsuru Inoue, Utsunomiya; Kazunori Iwamoto, Utsunomiya; Katsumi Asada, Utsunomiya; Hiroshi Ito, Fuchu, all of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/904,305

[22] Filed: Jul. 31, 1997

[30] Foreign Application Priority Data

Aug. 2, 1996 [JP] Japan .................................. 8-219040

[51] Int. Cl.⁶ .......................... G03B 27/42; G03B 27/58
[52] U.S. Cl. ............................. 355/53; 355/72; 356/375
[58] Field of Search ..................... 355/53, 72; 356/375, 356/399, 400, 401; 250/492.2; 108/20; 248/566; 378/34

[56] References Cited

U.S. PATENT DOCUMENTS

| | | |
|---|---|---|
| 4,854,444 | 8/1989 | Iwamoto . |
| 5,040,431 | 8/1991 | Sakino et al. . |
| 5,128,975 | 7/1992 | Iwamoto et al. . |
| 5,160,961 | 11/1992 | Marumo et al. . |
| 5,168,512 | 12/1992 | Iwamoto et al. . |
| 5,191,218 | 3/1993 | Mori et al. . |
| 5,194,893 | 3/1993 | Nishi . |
| 5,226,523 | 7/1993 | Kawakami et al. . |
| 5,231,291 | 7/1993 | Amemiya et al. . |
| 5,280,677 | 1/1994 | Kubo et al. . |
| 5,281,996 | 1/1994 | Bruning et al. . |
| 5,467,720 | 11/1995 | Korenaga et al. . |
| 5,504,407 | 4/1996 | Wakui et al. . |
| 5,511,930 | 4/1996 | Sato et al. . |
| 5,524,502 | 6/1996 | Osanai . |
| 5,610,686 | 3/1997 | Osanai . |
| 5,640,440 | 6/1997 | Kuno et al. . |
| 5,684,856 | 11/1997 | Iwamoto et al. . |
| 5,685,232 | 11/1997 | Inoue . |
| 5,691,806 | 11/1997 | Tokuda et al. ........................... 355/72 |
| 5,701,041 | 12/1997 | Akutsu et al. .......................... 310/12 |
| 5,717,482 | 2/1998 | Akutsu et al. .......................... 355/53 |
| 5,767,948 | 6/1998 | Loopstra et al. ....................... 355/53 |
| 5,781,277 | 7/1998 | Iwamoto ................................. 355/53 |
| 5,796,469 | 8/1998 | Ebinuma ................................. 355/53 |

Primary Examiner—Alan A. Mathews
Attorney, Agent, or Firm—Fitzpatrick, Cella, Harper & Scinto

[57] ABSTRACT

A stage apparatus has a stationary portion, a movable portion and a linear motor for moving the movable portion in a prescribed direction by applying thrust between the stationary and movable portions. A first supporting member supports the stationary portion with a degree of freedom in the direction of movement, and a second supporting member has an axial supporting member for supporting the stationary portion rigidly in the direction of movement and flexibly in other directions. The second supporting member is isolated from the first supporting member in such a manner that vibration will not be transmitted to the first supporting member. The stage is used to scan a master plate in a scanning-type exposure apparatus, and the first supporting member is joined to a lens barrel table on which a projecting optical system is mounted.

24 Claims, 26 Drawing Sheets

STAGE AND EXPOSURE APPARATUS USING SAME

BACKGROUND OF THE INVENTION

This invention relates to an exposure apparatus for exposing the resist on a substrate to a design pattern when a semiconductor device or the like is manufactured, a method of manufacturing devices using this exposure apparatus, and a stage applicable to this apparatus and method.

Examples of such exposure apparatus known in the art include a stepper which sequentially exposes a plurality of exposure areas on a substrate such as a wafer to a pattern on a master plate via a projecting optical system while the substrate is moved in steps, and a scanning-type exposure apparatus which moves a master plate such as a mask and a substrate relative to a projecting optical system and scans the master plate and the substrate by slit-shaped exposing light to thereby expose the substrate to the pattern on the master plate by scanning.

A step-and-scan-type exposure apparatus has been proposed in recent years. This apparatus exposes a plurality of areas on a substrate to a fine pattern in highly precise fashion by repeating the above-mentioned stepping motion and scanning exposure in such a manner that exposure of a fine pattern can be carried out with greater accuracy. This exposure apparatus is so adapted that exposing light is limited by a slit so that only a portion of the light comparatively near the optic axis of the projecting optical system is used. This makes possible the exposure of a fine pattern with improved accuracy.

However, in an exposure apparatus such as the step-and-scan-type exposure apparatus the purpose of which is highly precise exposure, a decline in overlay accuracy and in the precision of the exposed image is caused by slight vibration or deformation of the apparatus owing to a reaction force produced at the time of acceleration when the master plate or substrate is moved in the scanning direction. Waiting for this vibration or deformation to diminish before performing exposure results in a decline in throughput.

SUMMARY OF THE INVENTION

Accordingly, an object of the present invention is to provide an exposure apparatus, a device manufacturing method and a stage whereby the influence of a reaction force, which is produced at the time of acceleration when a master plate or substrate is moved in the scanning direction, is eliminated without lowering throughput, thereby making it possible to fully manifest the performance of the projecting optical system and to improve exposure accuracy.

According to the present invention, the foregoing object is attained by providing a stage having a stationary portion, a movable portion and driving means for applying thrust between the stationary and movable portions to thereby move the movable portion in a predetermined direction of movement, comprising first supporting means for supporting the stationary portion with a degree of freedom in the direction of movement, and second supporting means having axial supporting means for supporting the stationary portion rigidly in the direction of movement and flexibly in other directions, the second supporting means being isolated from the first supporting means in such a manner that vibration will not be transmitted to the first supporting means.

Examples of the axial supporting means are an elastic hinge such as a cross leaf-spring hinge or cylindrical spring hinge; a swivel link and a pre-loaded spring for applying pre-load to the link portion; a wire stretched in the direction of movement and means for clamping the wire; an air pad acted upon by a force in the direction of movement, and a magnet for applying pre-load to the air pad in the direction of movement; and means for supporting the stationary portion via thrust applying means which applies thrust in the direction of movement to the stationary portion.

Examples of the thrust applying means are means for sensing relative velocity between the stationary portion and the second supporting means and applying thrust to the stationary portion so as to reduce the relative velocity; means for sensing velocity, position or acceleration of the stationary portion and, on the basis thereof, applying thrust to the stationary portion in such a manner that the absolute position of the stationary portion is rendered constant; and means for sensing the position of the stationary portion and applying thrust to the stationary portion, in such a manner that the absolute position of the stationary portion is rendered constant, based upon the sensed position and a predicted value of thrust applied to the stationary portion.

The second supporting means preferably has attenuating means such as a damper or electromagnetic damper for attenuating vibration of the second supporting means per se. The mass of the second supporting means preferably is greater than the mass of the movable portion.

The stage further comprises position measuring means for measuring the position of the movable portion using the position of the first supporting means as a reference.

In accordance with another aspect of the invention, there is provided an exposure apparatus comprising exposure means for projecting part of a pattern of a master plate onto a substrate via a projecting optical system by illuminating light obtained from an illuminating optical system and moving the master plate and the substrate with respect to the projecting optical system to thereby print the pattern of the master plate on the substrate, mask means for moving a masking plate in conformity with movement of the master plate at a position in the illuminating optical system conjugate with the master plate, thereby delineating an exposure area of the master plate, and the above-described stage, wherein the first supporting means is joined to a lens barrel table on which the projecting optical system is mounted, and the second supporting means is joined to a reaction-force receiving member for a reaction force produced when the masking plate of the mask means is moved.

A linear motor, for example, can be used as the driving means, in which case the stationary portion would have the stator of the linear motor and the movable portion would have the movable element of the linear motor. A linear motor or other actuator can be used as the thrust applying means.

In another aspect of the invention, there is provided an exposure apparatus exposure means for projecting part of a pattern of a master plate onto a substrate via a projecting optical system and moving the master plate and the substrate with respect to the projecting optical system to thereby print a prescribed exposure area of the pattern of the master plate on the substrate, and the above-described stage for moving the master plate in order to perform scanning, wherein the first supporting means is joined to a lens barrel table on which the projecting optical system is mounted.

More specifically, the apparatus has three struts, for example, for supporting the lens barrel table, and the second supporting means of the stage has a bottom portion connected via a leaf spring to a lower portion of each of the three struts rigidly in the horizontal direction and flexibly in the vertical direction, a column member extending upwardly from the bottom portion, and a connecting member extending in the scanning direction from the column member and connected to the stationary portion of the stage, wherein the connecting member constructs the axial supporting means of the stage. In this case, the apparatus further includes a base frame joined to a lower portion of each of the three struts, and elastic means interposed between the base frame and the bottom portion of the second supporting means for applying a vertically directed elastic force to the bottom portion.

Alternatively, the apparatus further includes three struts for supporting the lens barrel table via a damper, and a base frame joined to a lower portion of each of the three struts, wherein the second supporting means of the stage has a column member extending upwardly from the base frame, and a connecting member extending in the scanning direction from the column member and connected to the stationary portion of the stage, the connecting member constructing the axial supporting means of the state.

A method of manufacturing a device according to the present invention includes projecting a portion of a pattern of a master plate onto a substrate via a projecting optical system and moving the master plate and the substrate with respect to the projecting optical system to thereby expose the substrate to a prescribed exposure area of the pattern of the master plate by scanning, wherein when the master plate is moved in the scanning direction using the above-described exposure apparatus to perform the exposure by scanning, a reaction force produced in the stationary portion of the stage of the exposure apparatus is received by the second supporting means of the stage.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE PREFERRED EMBODIMENTS

Preferred embodiments of the present invention will now be described in detail in accordance with the accompanying drawings.

Figure 1:
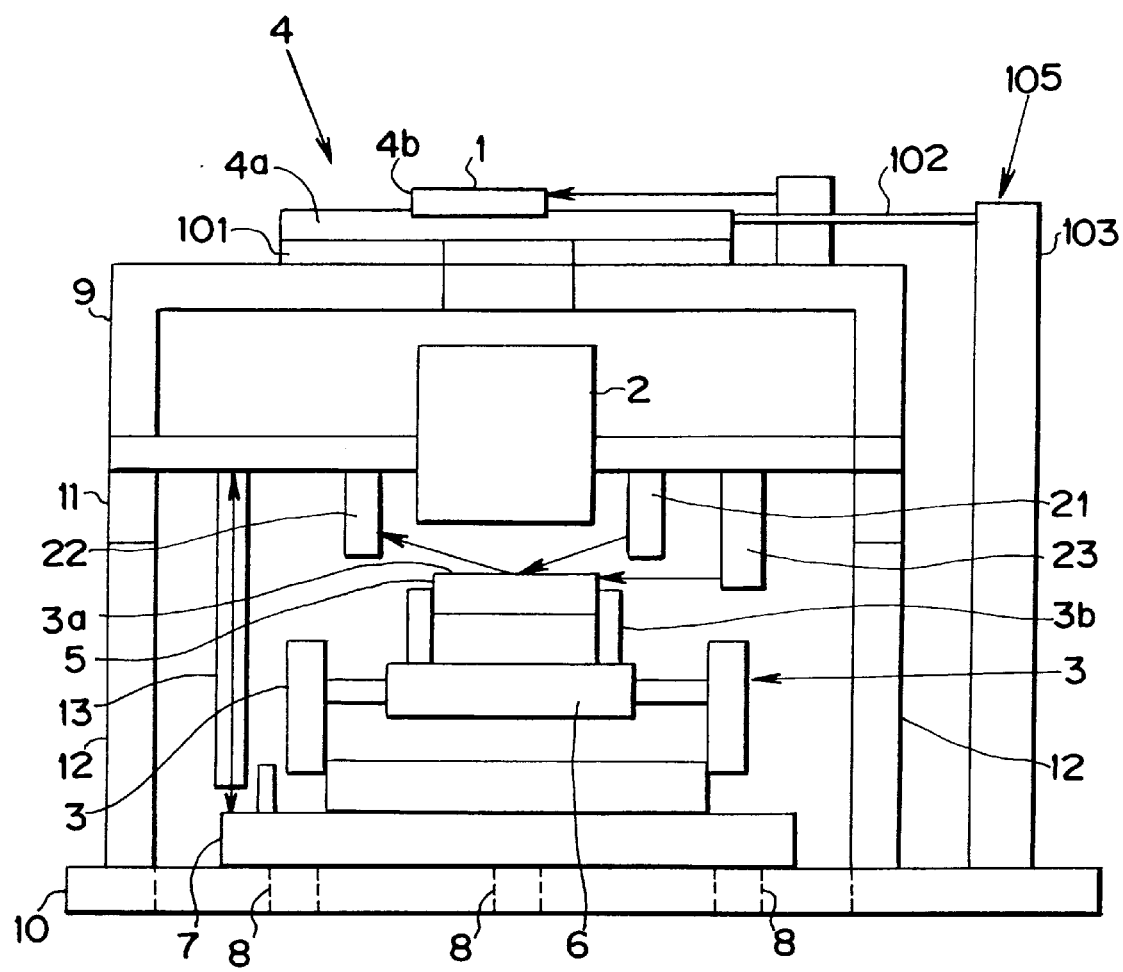
FIG. 1 is a schematic view illustrating a side view of an exposure apparatus according to an embodiment of the present invention.
Figure 1:
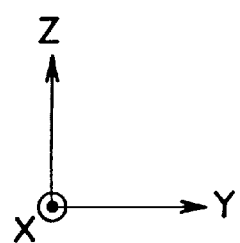
Figure 2:
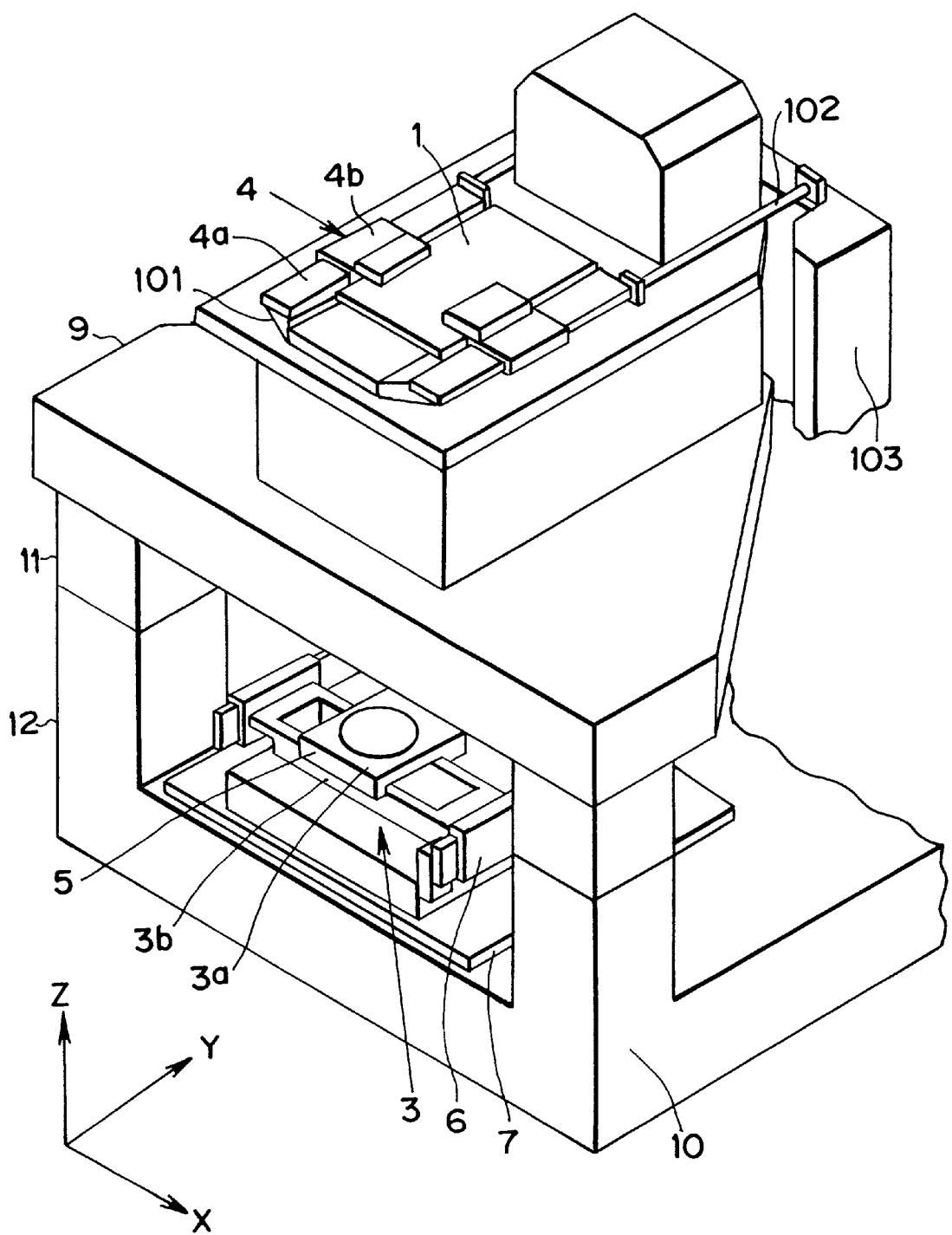
FIG. 2 is a perspective view illustrating the external appearance of the exposure apparatus shown in FIG. 1.

FIG. 1 is a schematic view illustrating a side view of an exposure apparatus according to an embodiment of the present invention, and FIG. 2 is a perspective view illustrating the external appearance of the exposure apparatus. The exposure apparatus shown in these drawings is a so-called step-and-scan-type exposure apparatus in which part of a reticle pattern is projected onto a wafer on an X-Y stage 3 via a projecting optical system 2, the reticle and wafer are scanned synchronously in the Y direction with respect to the projecting optical system 2 to thereby expose the wafer to the pattern of the reticle, and the scanning exposure is performed while interposing stepping motion in order to repeatedly perform the exposure with respect to a plurality of areas on the wafer.

Movement of the reticle in the scanning (Y) direction is performed by a stage apparatus on the reticle side. The stage has a linear motor 4 which moves a movable element 4b in the scanning direction by applying thrust between a stator 4a and the movable element 4b. A reticle stage 1 is joined to the movable element 4b. The stator 4a is supported by a first supporting member 101 with a degree of freedom in the Y direction. Further, the stator 4a is supported by a second supporting member 105 rigidly in the Y direction and flexibly in other directions. The second supporting member 105 has a column 103 extending upwardly from a base frame 10, and an axial supporting member 102 extending in the Y direction from the column 103 for supporting the stator 4a rigidly in the Y direction and flexibly in other directions.

The reticle stage 1 which carries the reticle is driven in the Y direction by the linear motor 4. The X-Y stage 3 which carries the wafer has an X stage 3a driven in the X direction by a linear motor 5 and a Y stage 3b driven in the Y direction by a linear motor 6. Synchronous scanning of the reticle and wafer is carried out by driving the reticle stage 1 and Y stage 3b in the Y direction at a fixed velocity ratio (e.g. 4:1). Stepping in the X direction is performed by the X stage 3a.

The X-Y stage 3 is provided on a stage table 7, which is supported on a platform or the like at three points via three dampers 8. The first supporting member 101 and the optical system 2 are provided on a lens barrel table 9, which is supported on the base frame 10 via three dampers 11 and three struts 12. Here each damper 8 is an active damper which actively suppresses or eliminates vibration along six axes. However, a passive damper may be used or the stage table 7 may be supported without the intervention of dampers.

Figure 3:
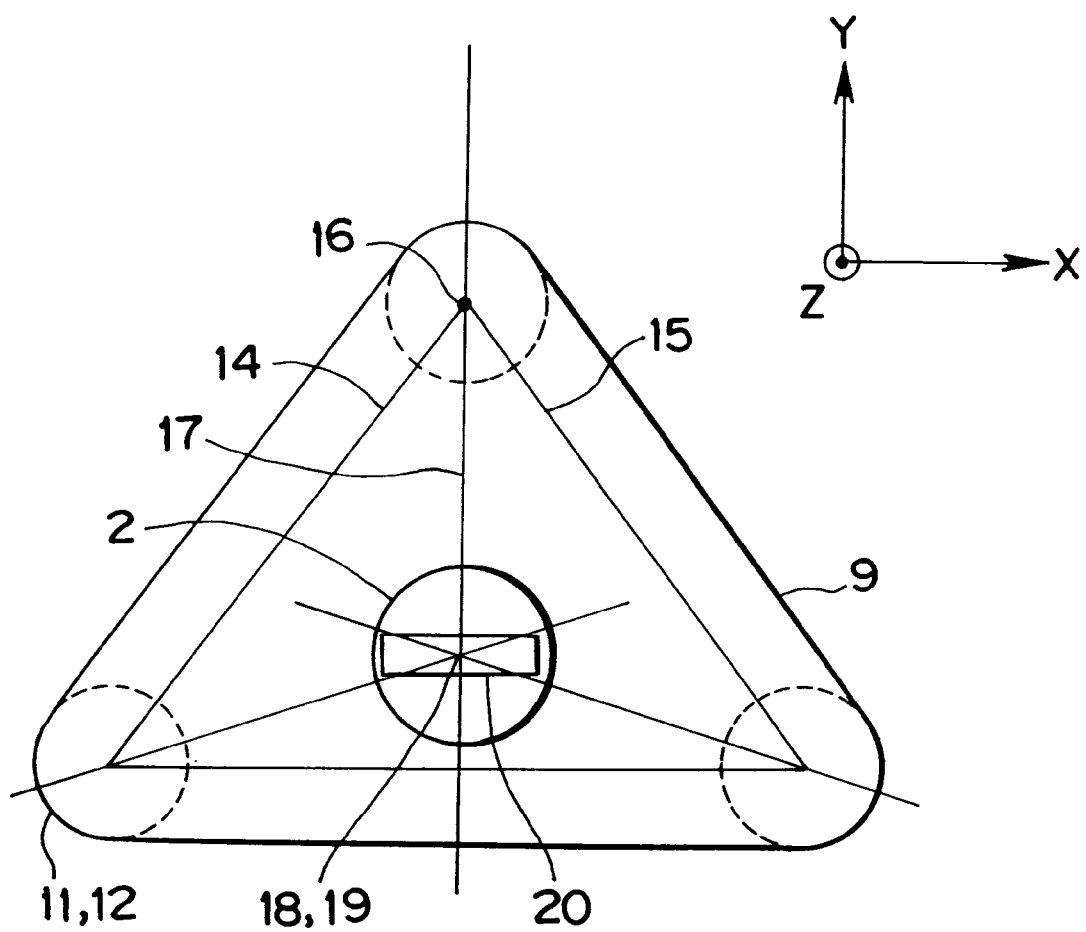
FIG. 3 is a diagram illustrating the positional relationship among dampers or struts, scanning direction at the time of scanning exposure, a projecting optical system and exposing light in the apparatus of FIG. 1 when the apparatus is viewed from above.

FIG. 3 is a diagram illustrating the positional relationship among the dampers 11 (or struts 12), scanning direction at the time of scanning exposure, the projecting optical system 2 and exposing light when the apparatus is viewed from above. As shown in FIG. 3, the three support points of the lens barrel table 9 provided by the dampers 11 and struts 12 define an isosceles triangle. The scanning direction Y is parallel to a straight line 17 connecting the centroid 28 of the triangle and a point 16 at which two equal sides 14, 15 intersect. The centroid 18 of the isosceles triangle and a centroid 19 of the projecting optical system 2 substantially coincide. A cross section of the exposing light, which has been formed into the shape of a slit, is indicated at 20 in FIG. 3. The longitudinal direction of the slit is a direction (the X direction) perpendicular to scanning direction. Two of the three dampers 11 are situated at the front of the apparatus and the remaining damper is situated at the rear. The path along which wafers are carried into the apparatus is set to extend from the front side of the apparatus to a point between the two struts situated at the front of the apparatus.

Figure 5:
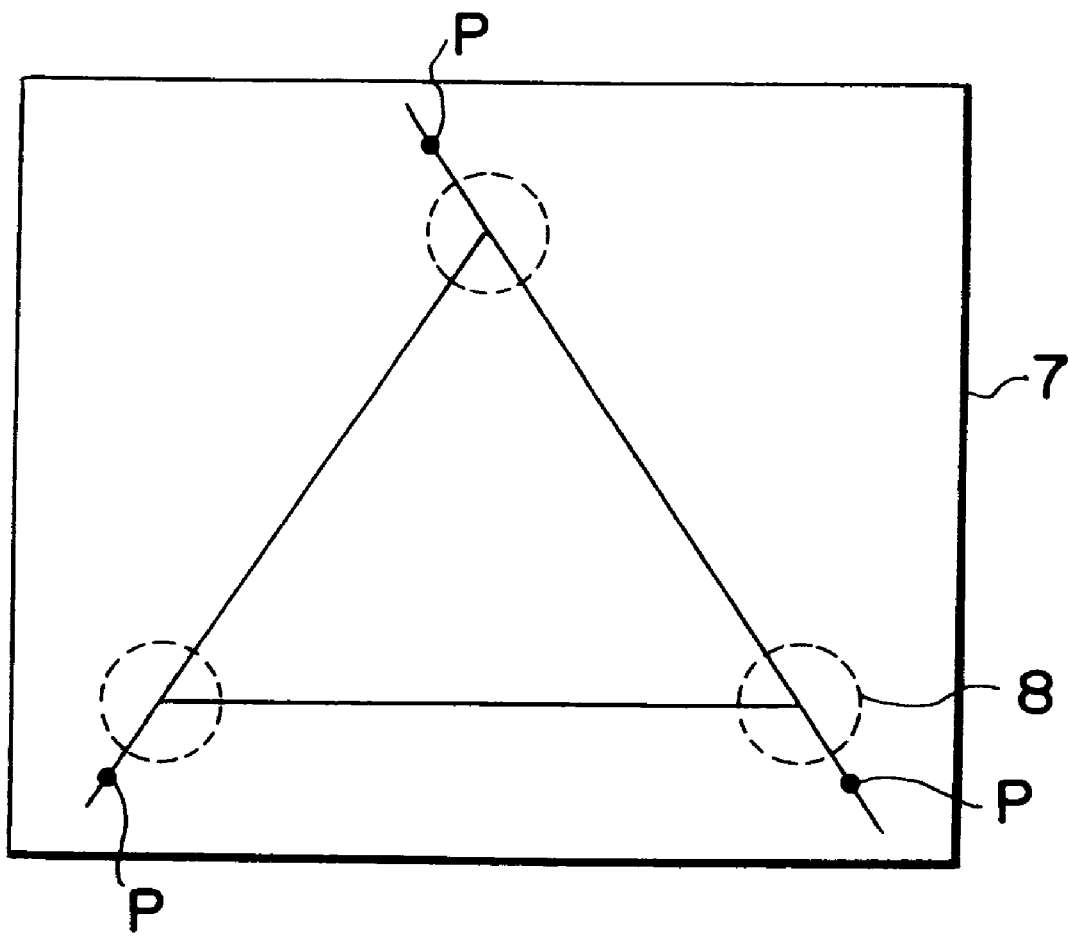
FIG. 5 is a diagram showing the positional relationship between support points of a stage table and measurement points of the stage table in the apparatus of FIG. 1.

The exposure apparatus is equipped with a distance measuring device 13 such as a laser interferometer or microencoder for measuring the distance between the lens barrel table 9 and the stage table 7 at three points. As shown in FIG. 5, three measurement points P of the distance measuring device 13 on the stage table 7 reside on straight lines passing through the apices of the triangle, which is constructed by the three points at which the dampers 8 support the stage table 7, and the midpoints of the sides adjacent these apices. Alternatively, it may be so arranged that measurement of the above-mentioned distance is performed at these measurement points upon taking into account the amount of deformation of the stage table 7 caused by movement of the X-Y stage 3 and measured in advance.

In the arrangement set forth above, a wafer is transported onto the X-Y stage 3 along the conveyance path between the two struts 12 at the front of the apparatus by a conveyance device, which is not shown. When prescribed positioning is completed, the exposure apparatus exposes a plurality of exposure areas on the wafer to the pattern on the reticle to effect transfer of the pattern to the wafer while repeating scanning exposure and stepping movement. In scanning exposure, the reticle stage 1 and Y stage 3b are moved at a predetermined velocity ratio along the Y direction (scanning direction) to scan the pattern on the reticle by the slit-shaped exposing light and scan the wafer by the projected image, whereby a prescribed area on the wafer is exposed to the pattern on the reticle. When the scanning exposure of one exposure area is finished, the X stage 3a is driven along the X direction o step the wafer and position another exposure area at the scanning exposure starting position, whereupon scanning exposure is carried out. It should be noted that the disposition of each exposure area, the scanning direction in either the positive or negative Y direction and the sequence through which the exposure areas are exposed have been set in such a manner that the plurality of exposure areas on the wafer can be successively exposed in an efficient manner by the combination of the stepping movement in the X direction and movement for scanning exposure in the Y direction.

Figures 4A, 4B:
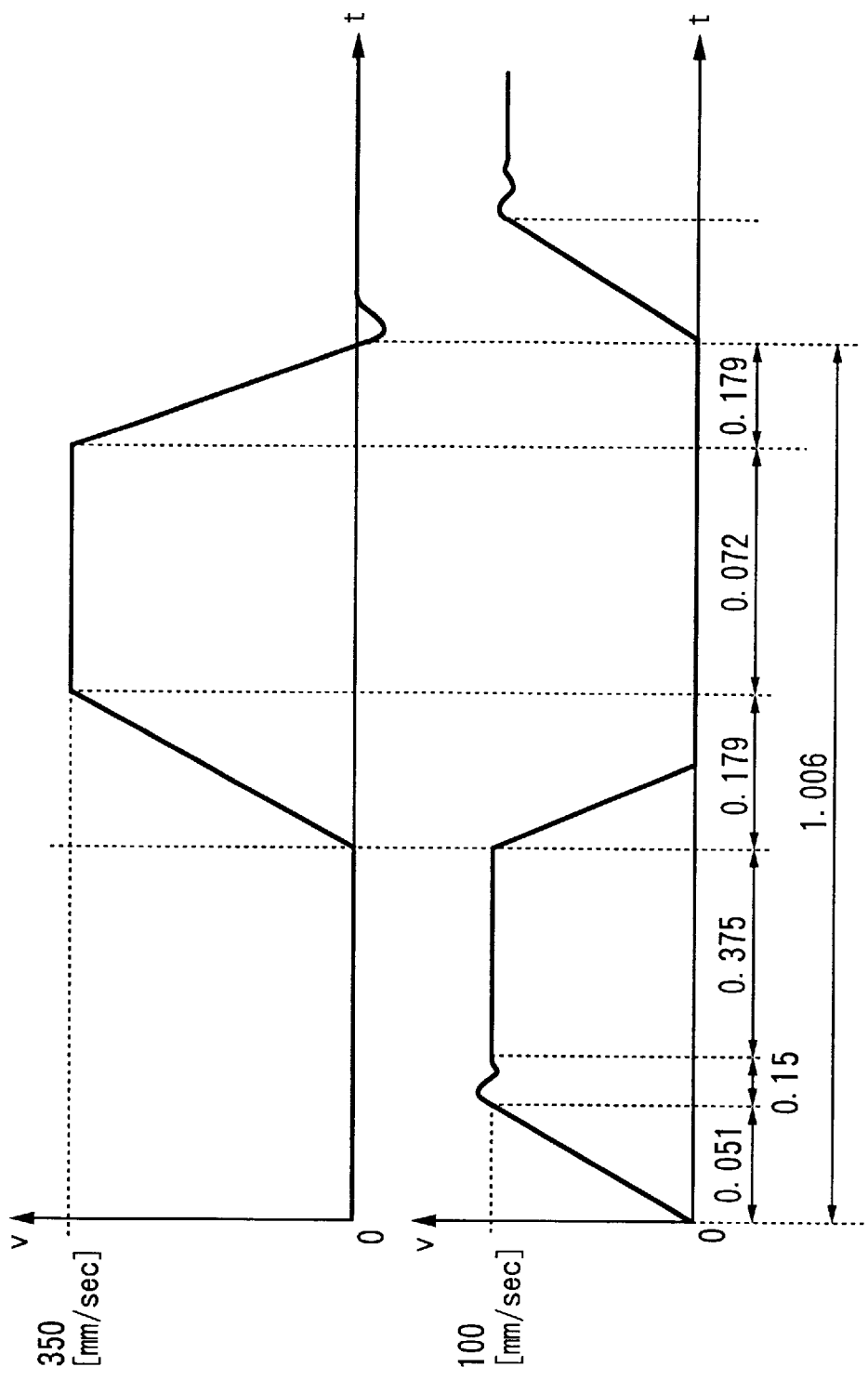
FIGS. 4A and 4B are graphs illustrating an example of the temporal change in traveling velocities of an X stage and a Y stage, respectively, in stepping movement and scanning exposure.

FIGS. 4A and 4B are graphs illustrating an example of the temporal change in traveling velocities of the X stage 3a and Y stage 3b, respectively, in stepping movement and scanning exposure. When acceleration of the Y stage is started, the Y stage passes through an acceleration interval having a duration of 0.051 s and a settling interval of 0.05 s before attaining a constant traveling velocity of 100 mm/s, which lasts for 0.375 s. Scanning exposure is performed during this movement at the constant velocity. At the end of the exposure interval the Y stage is decelerated, acceleration of the X stage begins and stepping movement is performed. When stepping ends, acceleration of the Y stage is started again in a manner similar to that previously described. By thus repeating movement of the X and Y tables, the plurality of exposure areas are successively scanned by and exposed to the pattern of the reticle.

With regard to the reticle stage 1, acceleration, settling, constant-velocity travel and deceleration are performed in sync with movement of the Y stage 3b at the predetermined velocity ratio mentioned above. At such time the stator 4a is acted upon by a reaction force commensurate with acceleration and deceleration. However, the stationary portion 4a is supported by the first supporting member 101 with a degree of freedom in the Y direction and by the second supporting member 105 rigidly in the Y direction and flexibly in other directions, and the second supporting member 105 and lens barrel table 9 are isolated from each other by the dampers 11 in such a manner that vibration will not be transmitted between them. As a result, the reaction force that acts upon the stator 4a is not transmitted to the lens barrel table 9 and is absorbed via the second supporting member 105.

An example of manufacture of a device in which this exposure apparatus can be utilized will be described.

Figure 6:
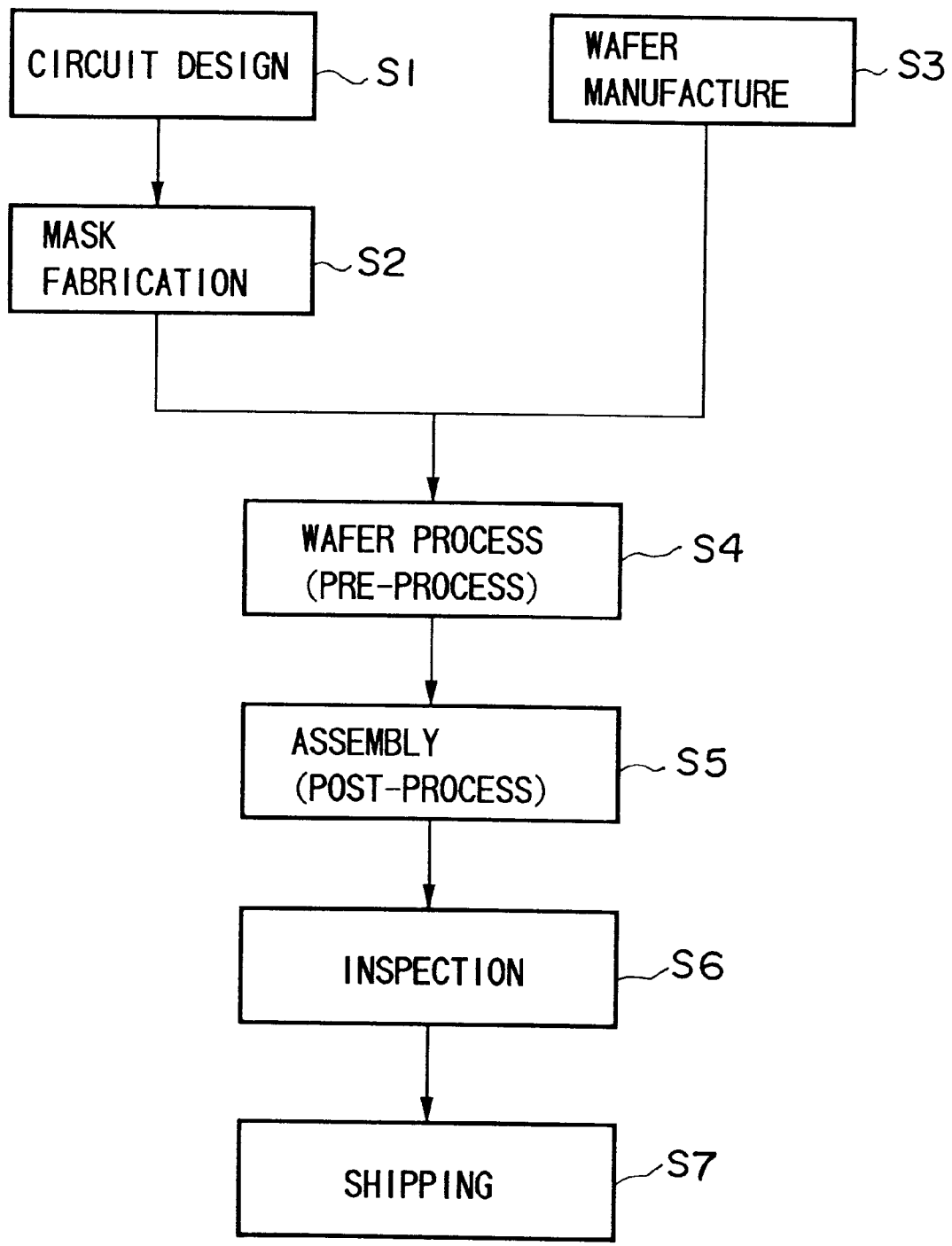
FIG. 6 is a flowchart illustrating the flow of manufacture of a microdevice capable of being manufactured by the apparatus of FIG. 1.

FIG. 6 illustrates the flow of manufacture of a microdevice (a semiconductor chip such as an IC or LSI chip, a liquid crystal panel, a CCD, a thin-film magnetic head, a micromachine, etc.). The circuitry of the semiconductor device is designed at step 1 (circuit design). A mask on which the designed circuit pattern has been formed is fabricated at step 2 (mask fabrication). Meanwhile, a wafer is manufactured using a material such as silicon at step 3 (wafer manufacture). The actual circuit is formed on the wafer by lithography, using the mask and wafer that have been prepared, at step 4 (wafer process), which is also referred to as a "pre-process". A semiconductor chip is obtained, using the wafer fabricated at step 4, at step 5 (assembly), which is also referred to as a "post-process". This step includes steps such as actual assembly (dicing and bonding) and packaging (chip encapsulation). The semiconductor device fabricated at step 5 is subjected to inspections such as an operation verification test and durability test at step 6 (inspection). The semiconductor device is completed through these steps and then is shipped (step 7).

Figure 7:
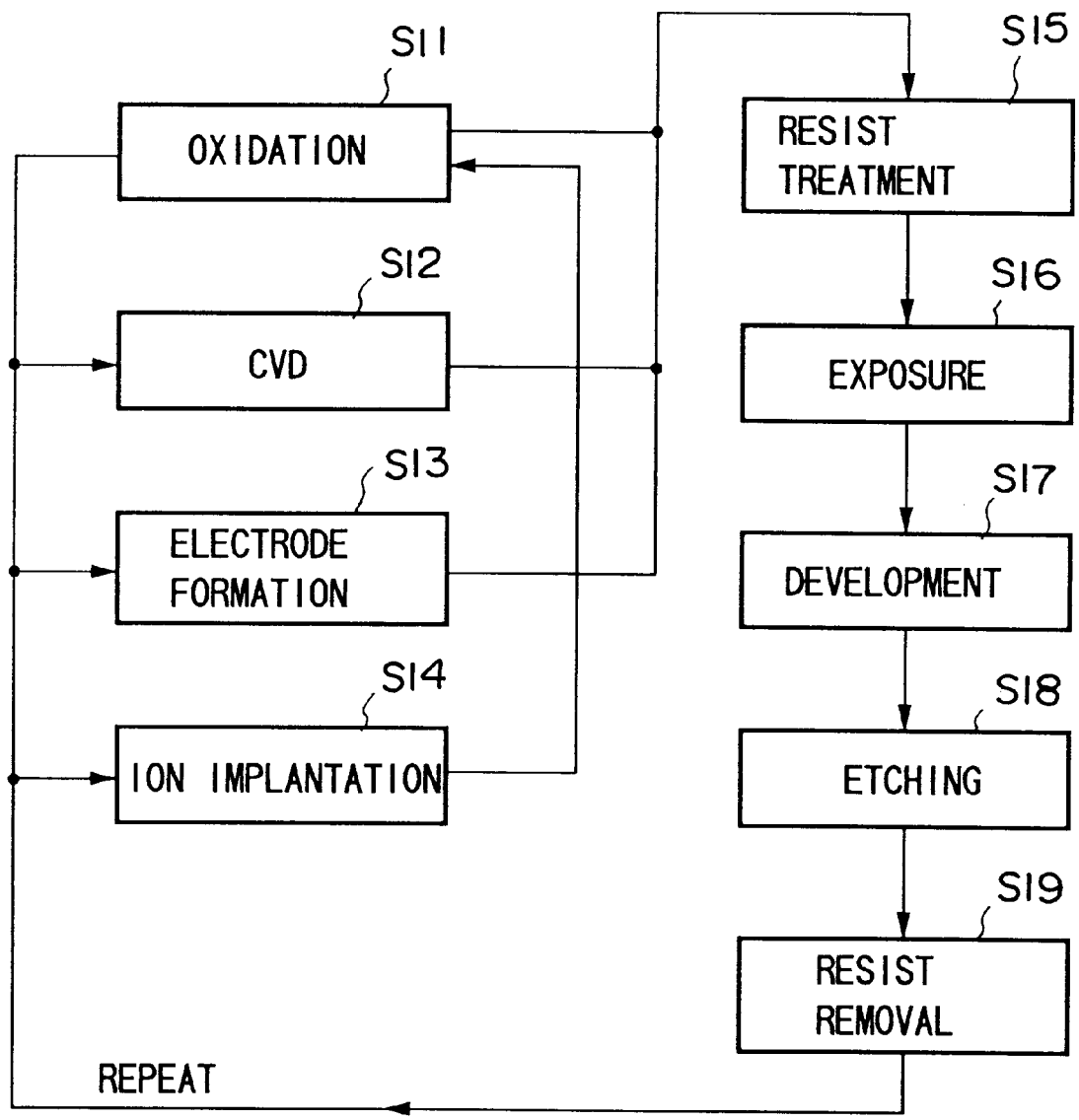
FIG. 7 is a flowchart illustrating the detailed flow of a wafer process in FIG. 6.

FIG. 7 is a flowchart illustrating the detailed flow of the wafer process mentioned above. The surface of the wafer is oxidized at step 11 (oxidation). An insulating film is formed on the wafer surface at step 12 (CVD), electrodes are formed on the wafer by vapor deposition at step 13 (electrode formation), and ions are implanted in the wafer at step 14 (ion implantation). The wafer is coated with a photoresist at step 15 (resist treatment), the wafer is exposed to the circuit pattern of the mask to print the pattern onto the wafer by the above-described exposure apparatus at step 16 (exposure), and exposed wafer is developed at step 17 (development). Portions other than the developed photoresist are etched away at step 18 (etching), and unnecessary resist left after etching is performed is removed at step 19 (resist removal). Multiple circuit patterns are formed on the wafer by implementing these steps repeatedly.

If the manufacturing method of this embodiment is employed, semiconductor devices having a high degree of integration can be manufactured at low cost. Manufacture of such semiconductor devices using the prior-art techniques is difficult.

Various embodiments of the axial supporting member 102 will be exemplified next.

Figure 8:
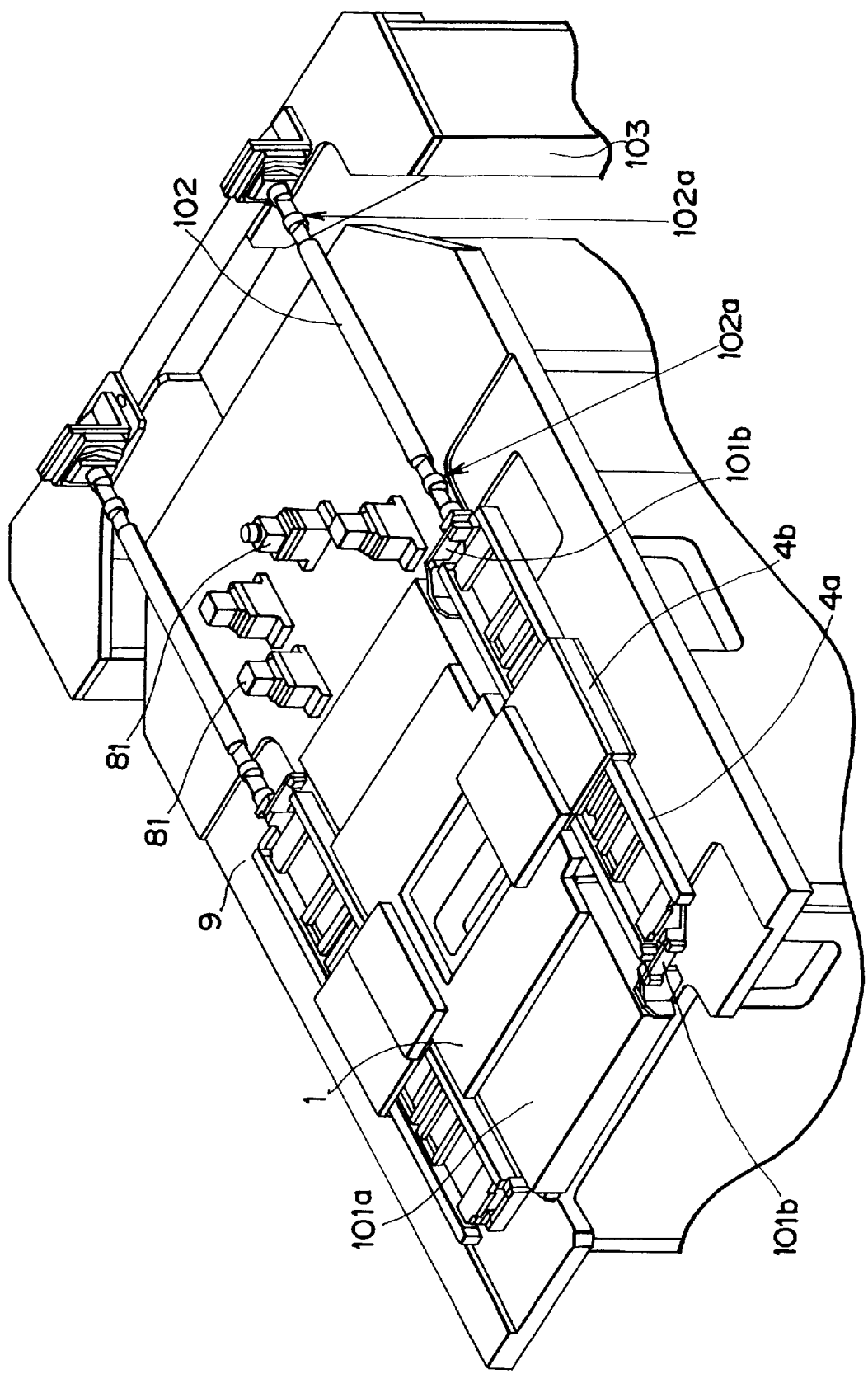
FIG. 8 is a perspective view showing a first embodiment of an axial supporting member in the apparatus of FIG. 1.
Figure 9:
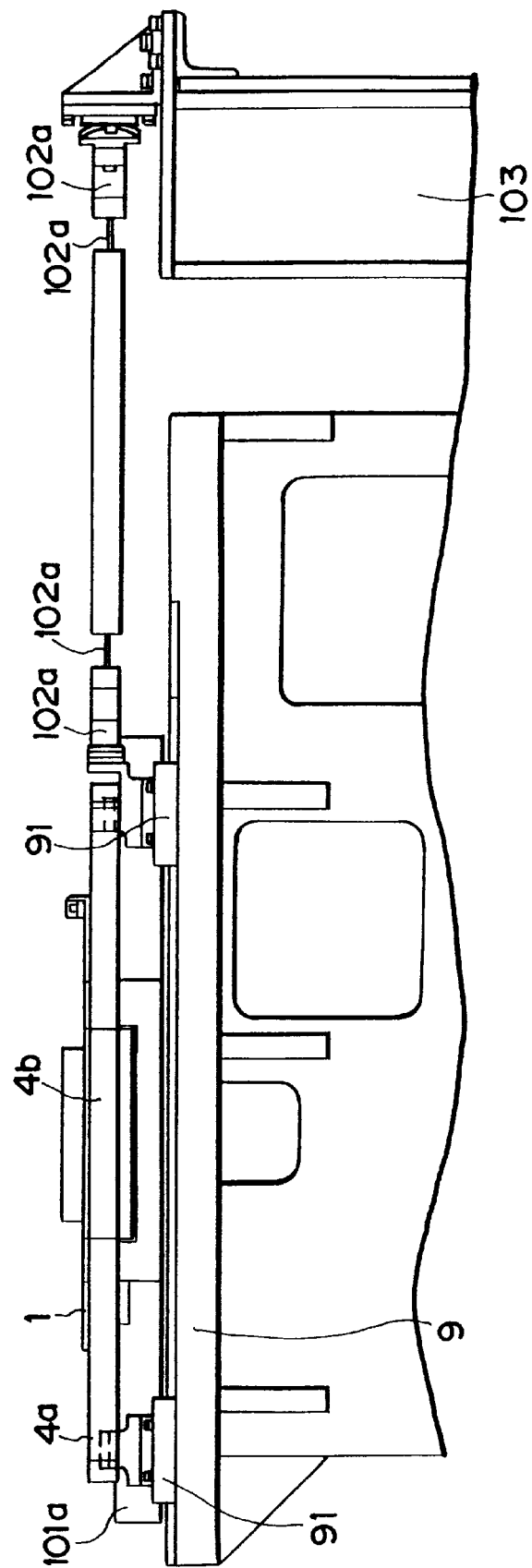
FIG. 9 is a side view of FIG. 8.

FIG. 8 is a perspective view showing a first embodiment of the axial supporting member 102, and FIG. 9 is a side view of FIG. 8. In this embodiment the axial supporting member 102 includes cross leaf-spring hinges 102a provided in the proximity of both ends of a rod-shaped member connecting the column 103 and stator 4a. As shown in FIG. 8, measuring devices 81 are for measuring the position of the reticle stage 1. The first supporting member 101 includes a stage table 101a secured to the lens barrel table 9, and an elastic guide 101b for supporting the stator 4a on the stage table 101a flexibly in the Y direction and rigidly in other directions. In FIG. 9 the first supporting member 101 has an air guide 9 that utilizes static pressure. Other devices that may be used for the first supporting member 101 include rolling or sliding guides, magnetically levitated guides, etc.

Figure 10:
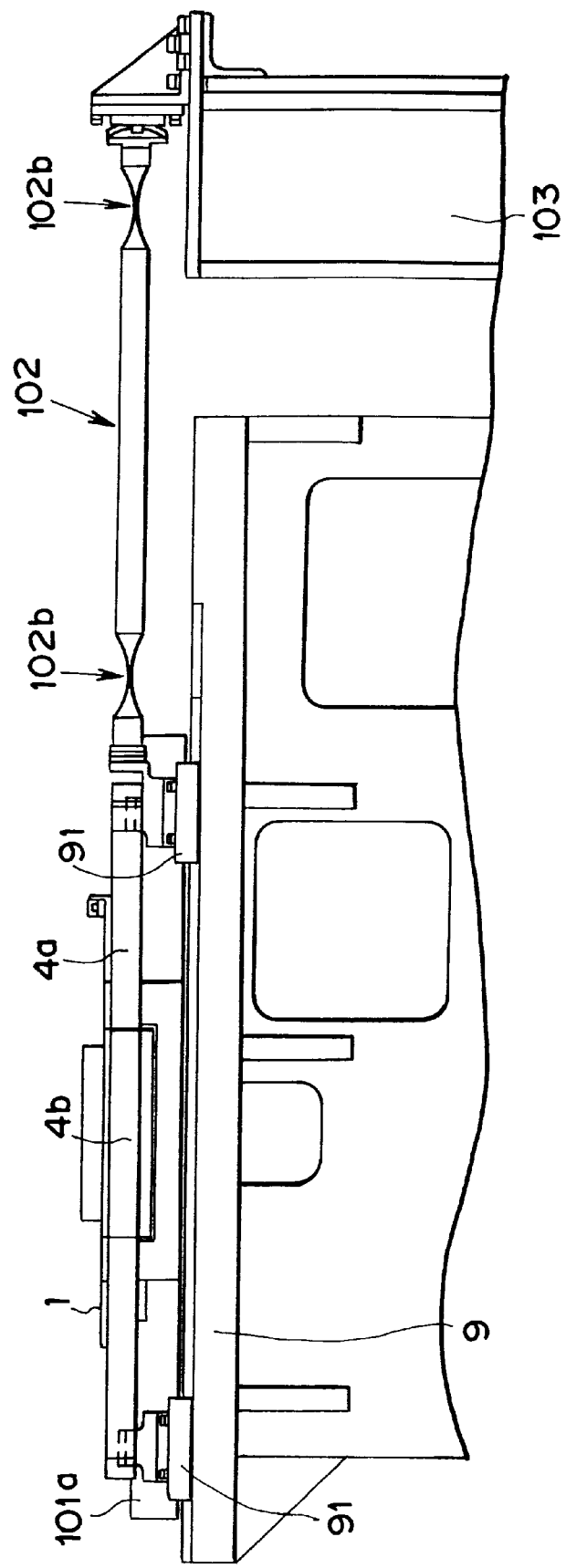
FIG. 10 is a side view showing a second embodiment of an axial supporting member in the apparatus of FIG. 1.

FIG. 10 is a side view showing a second embodiment of the axial supporting member 102. Here the axial supporting member 102 includes cylindrical spring hinges 102b provided in the proximity of both ends of a rod-shaped member connecting the column 103 and stator 4a.

Figure 11:
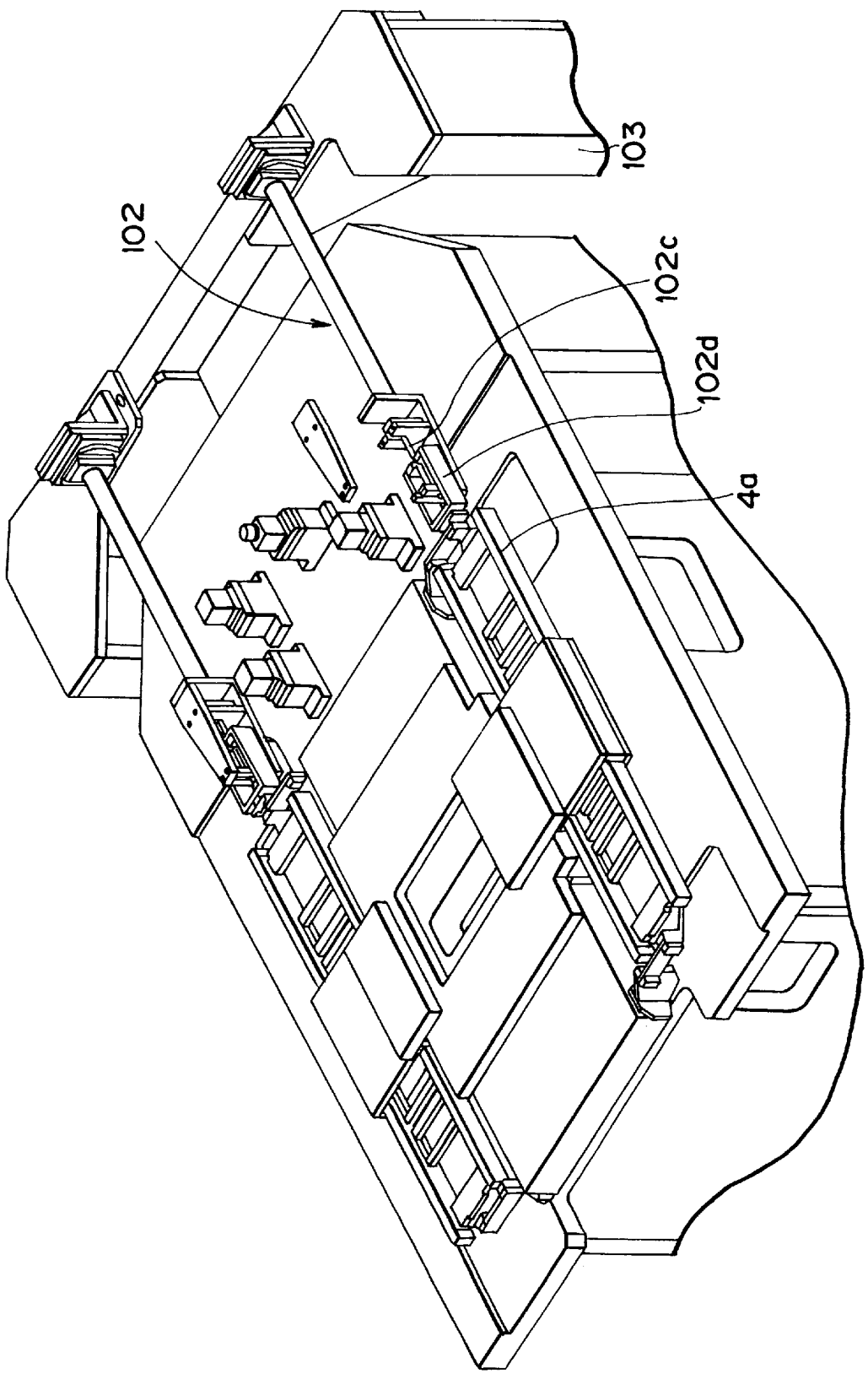
FIG. 11 is a perspective view showing a third embodiment of an axial supporting member in the apparatus of FIG. 1.

FIG. 11 is a perspective view showing a third embodiment of the axial supporting member 102. Here the axial supporting member 102 includes a wire 102c stretched in the Y direction at the end portion of a rod-shaped member extending in the Y direction from the column 103, and a member 102d one end of which clamps the end of the wire 102c and the other end of which is secured to the stator 4a.

Figure 12:
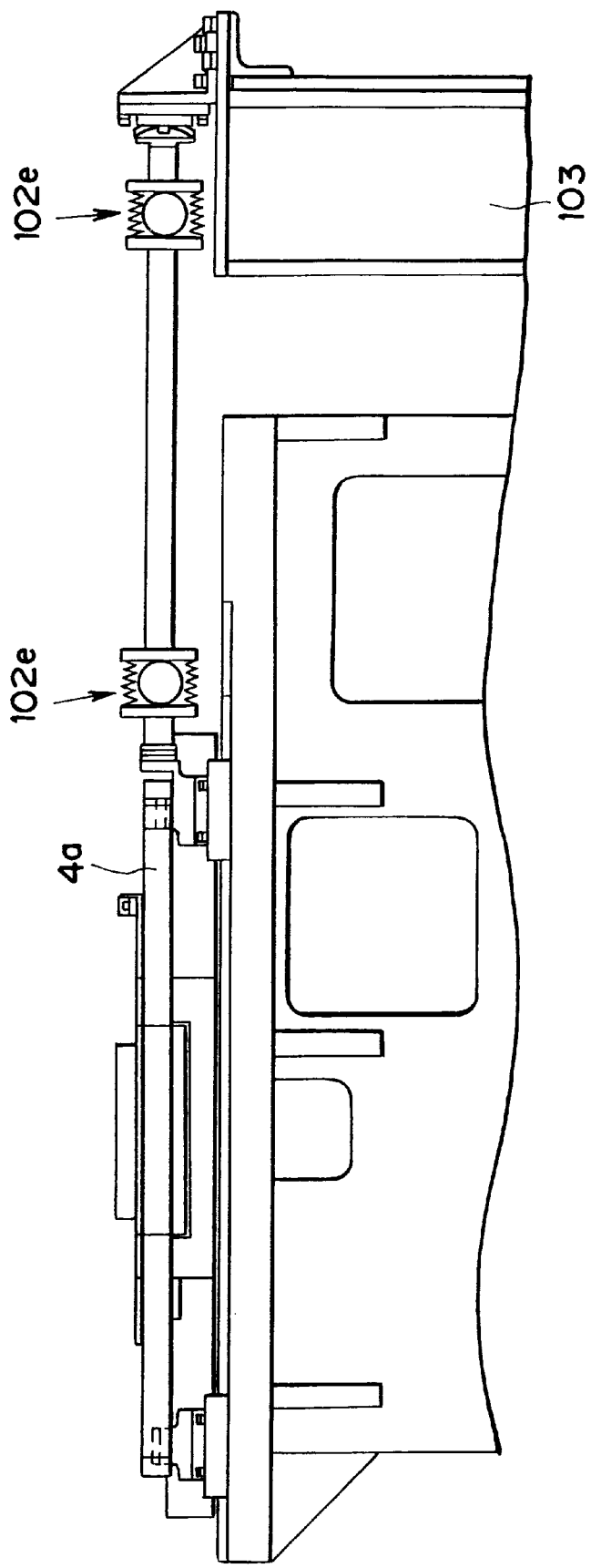
FIG. 12 is a side view showing a fourth embodiment of an axial supporting member in the apparatus of FIG. 1.

FIG. 12 is a side view showing a fourth embodiment of the axial supporting member 102. Here the axial supporting member 102 includes link members 102e, each of which comprises a swivel link and a pre-loaded spring, provided in the proximity of both ends of a rod-shaped member connecting the column 103 and stator 4a.

Figure 13:
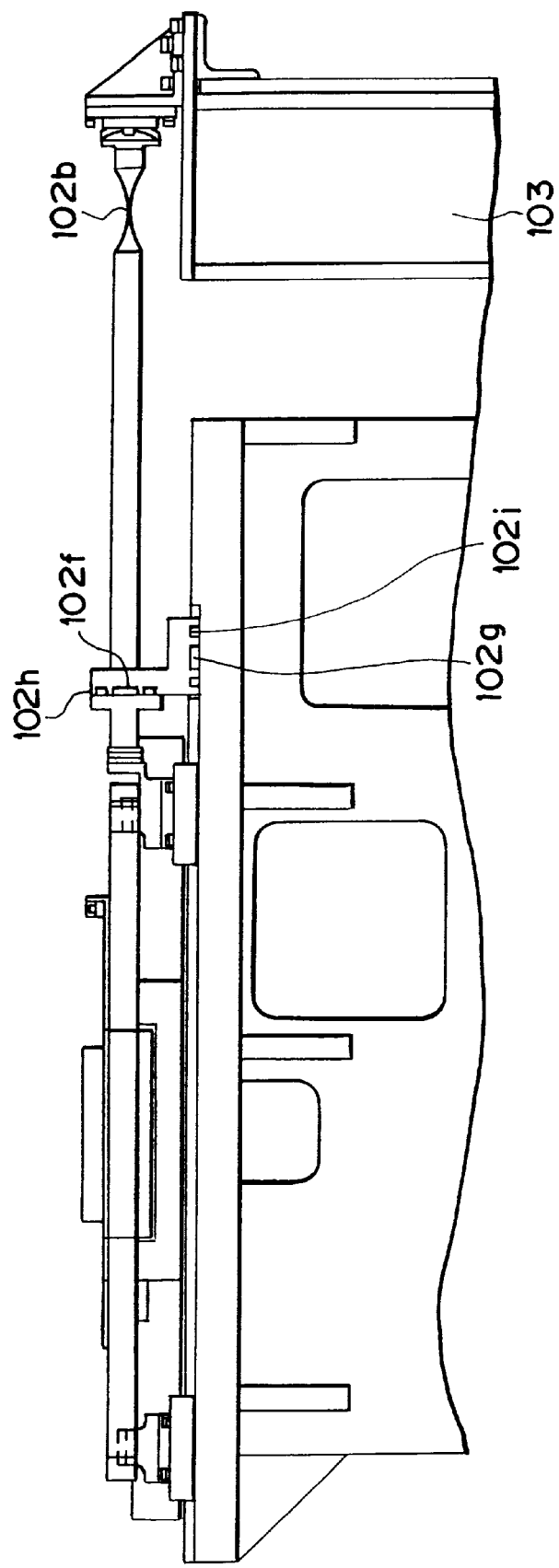
FIG. 13 is a side view showing a fifth embodiment of an axial supporting member in the apparatus of FIG. 1.

FIG. 13 is a side view showing a fifth embodiment of the axial supporting member 102. Here the axial supporting member 102 includes air pads 102f and 102g, which utilize static pressure, provided so as to be acted upon by forces in the Y and Z directions, in the proximity of the stator-end of the rod-shaped member connecting the column 103 and stator 4a, and magnets 102h and 102i for applying pre-load to the air pads 102f and 102g in the Y and Z directions, respectively. Further, the cylindrical spring hinge 102b is interposed between the other end of the rod-shaped member and the column 103.

Another embodiment of the second supporting member 105 will now be described. In the embodiments of FIGS. 1 and 2, the axial supporting member 102 is connected to the column 103 extending upwardly from the base frame 10. However, this does not impose a limitation upon the invention. An arrangement may be adopted in which the column 103 is provided on a member, which is different from the base frame 10, placed on floor, or in which the axial supporting member 102 is connected an illuminating system or thermal chamber. In other words, it will suffice if the arrangement is such that the reaction force that acts upon the stationary portion 4a is not transmitted to the lens barrel table 9.

Figure 14:
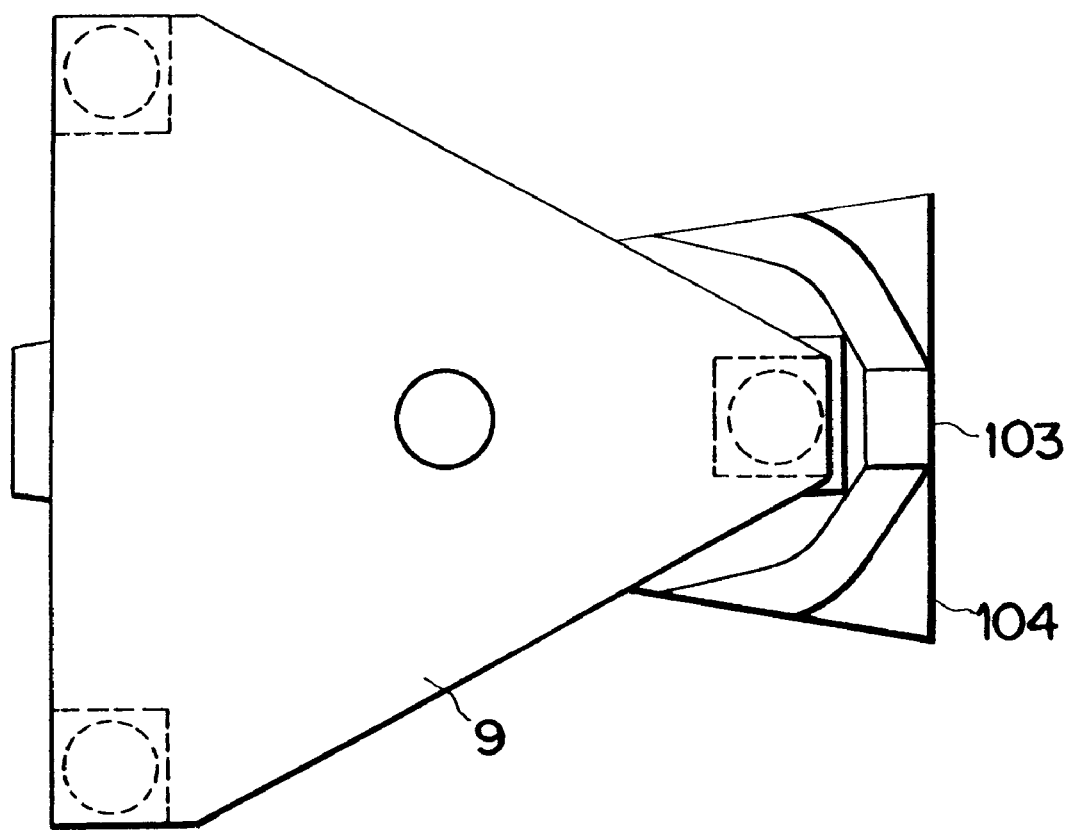
FIG. 14 is a plan view showing another example of a second supporting member in the apparatus of FIG. 1.
Figure 15:
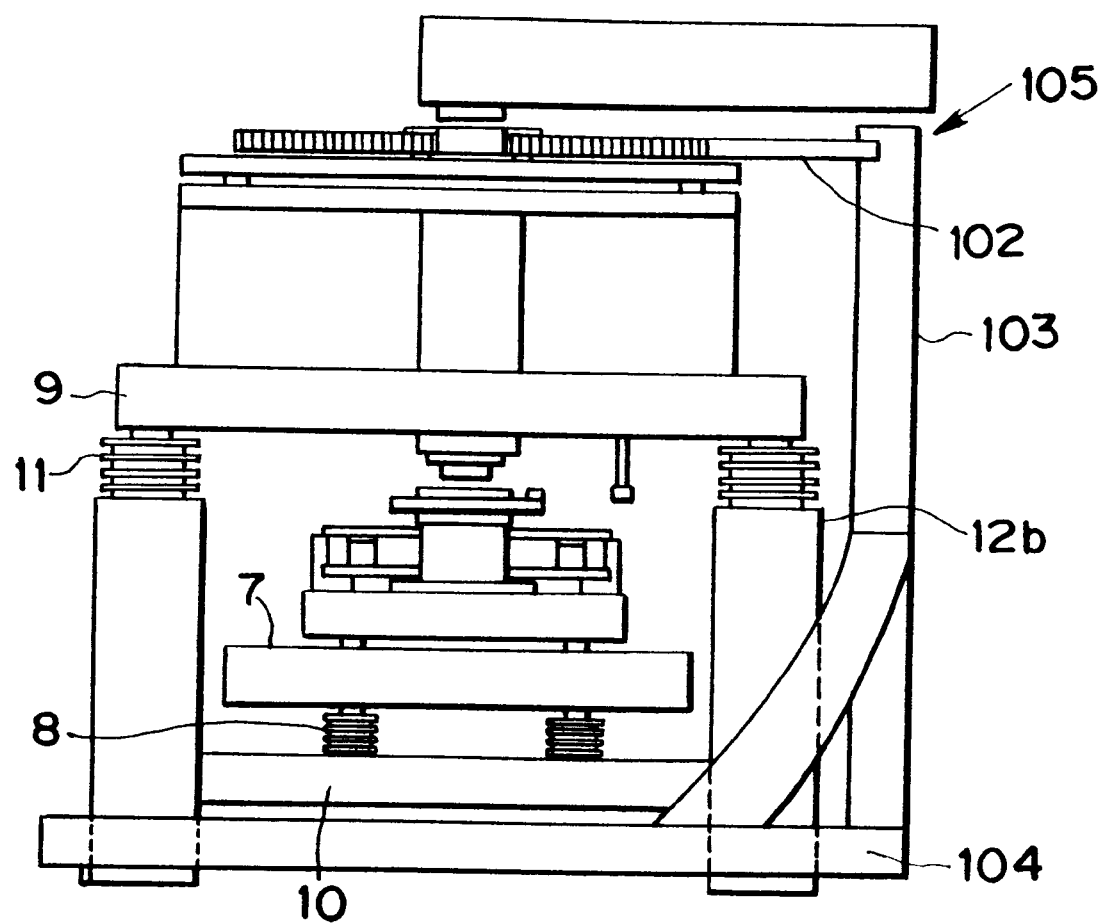
FIG. 15 is a side view of FIG. 14.
Figure 16:
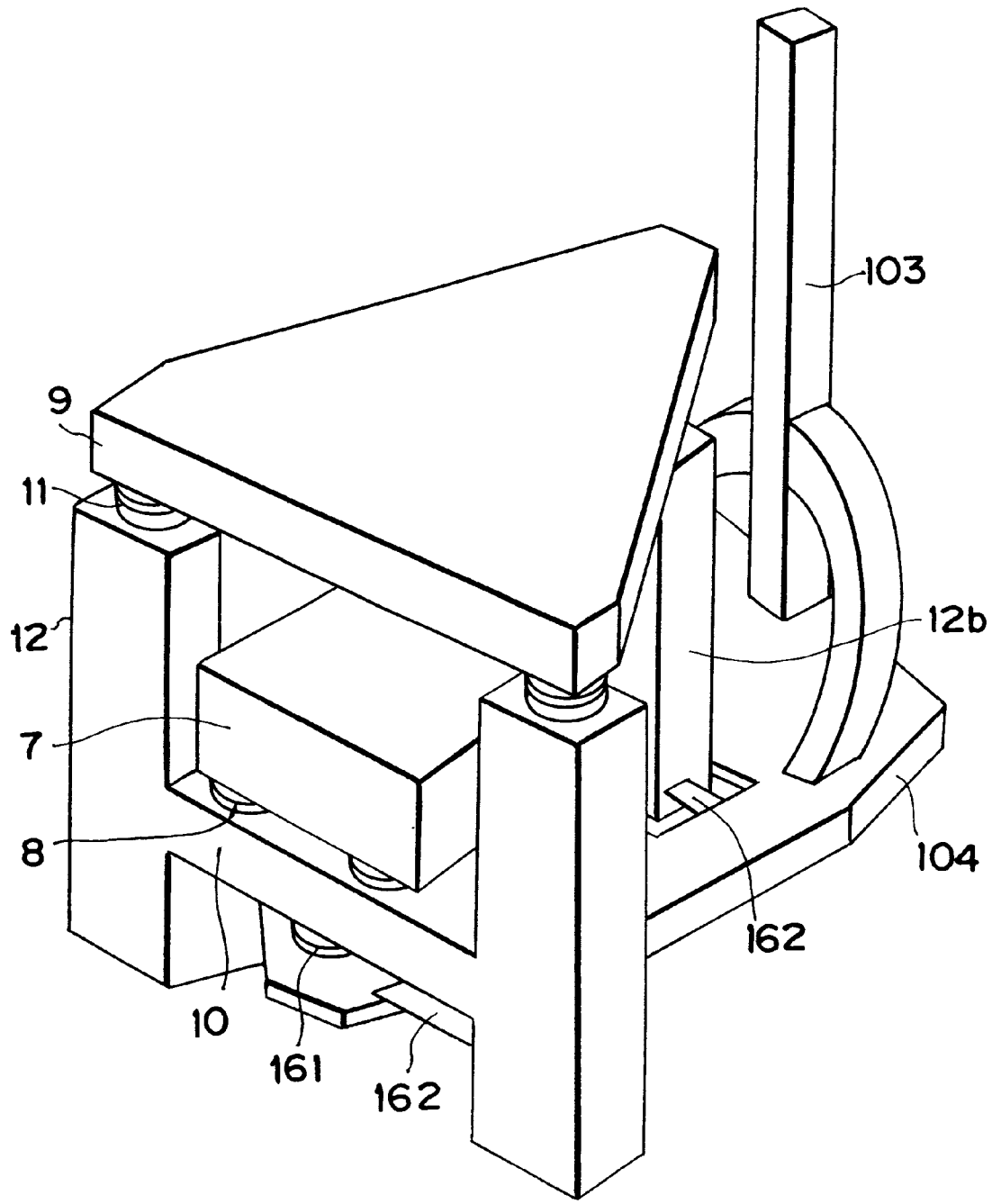
FIG. 16 is a perspective view of FIG. 14.
Figure 17:
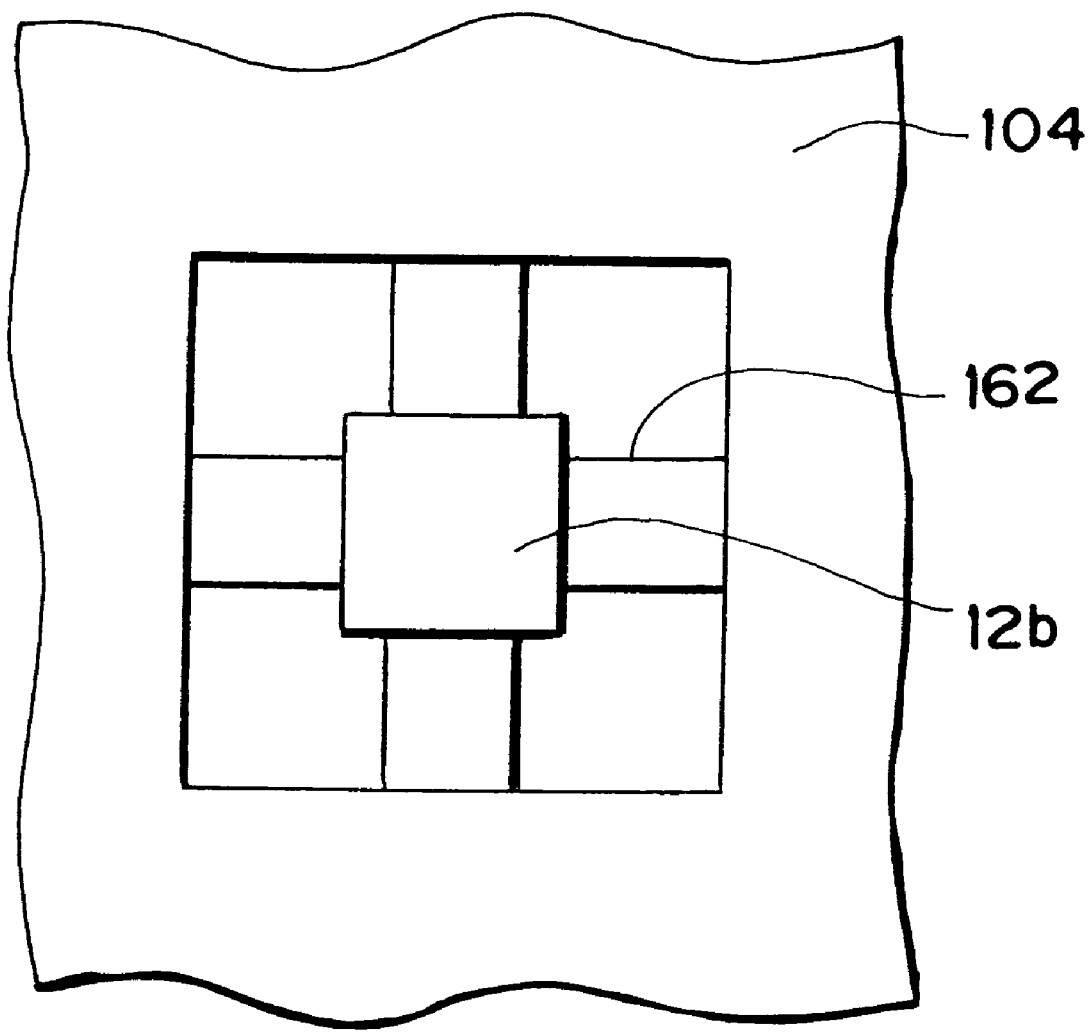
FIG. 17 is a top view of a connecting portion between a reaction-force supporting base and a strut by means of a leaf spring in the second supporting member of FIG. 14.

For example, FIGS. 14, 15 and 16 are a plan view, side view and perspective view, respectively, illustrating an example of a second supporting member in which the column 103 is provided on a base placed on the floor separately of the base frame 10. Only the principal supporting mechanism is illustrated in FIGS. 14 and 16. In this case, the stage table 7 is placed on the base frame 10 via the dampers 8. The column 103 of the second supporting member 105 is provided on a reaction-force supporting base 104 placed on the floor separately of the base frame 10. Further, each strut 12 and the reaction-force supporting base 104 are connected together rigidly in the horizontal direction and flexibly in the vertical direction via leaf springs 162. The strut 12b at the back of the apparatus is disposed so as to penetrate a hole in the reaction-force supporting base 104 and is connected to the reaction-force supporting base 104 in four directions by four of the leaf springs 162, as shown in FIG. 17. Further, an air spring 161 is placed between the base frame 10 and the reaction-force supporting base 104 on the front side of these components.

In this case the rigidity in the second supporting member 105 considered to be small with respect to the reaction force received by the second supporting member 105, at acceleration and deceleration of the reticle stage is mainly the flexural rigidity of the reaction-force supporting base 104. However, since the connection provided by the leaf springs 162 is flexible in the vertical direction and the air spring 161 is interposed between the base frame 10 and the base 104, the flexural rigidity is capable of preventing the dominant characteristic vibration mode from being transmitted to the base frame 10. Further, since the connection provided by the leaf springs 162 is rigid in the horizontal direction, a positional deviation between the base frame 10 and the reaction-force supporting base 104 can be prevented.

Figure 18:
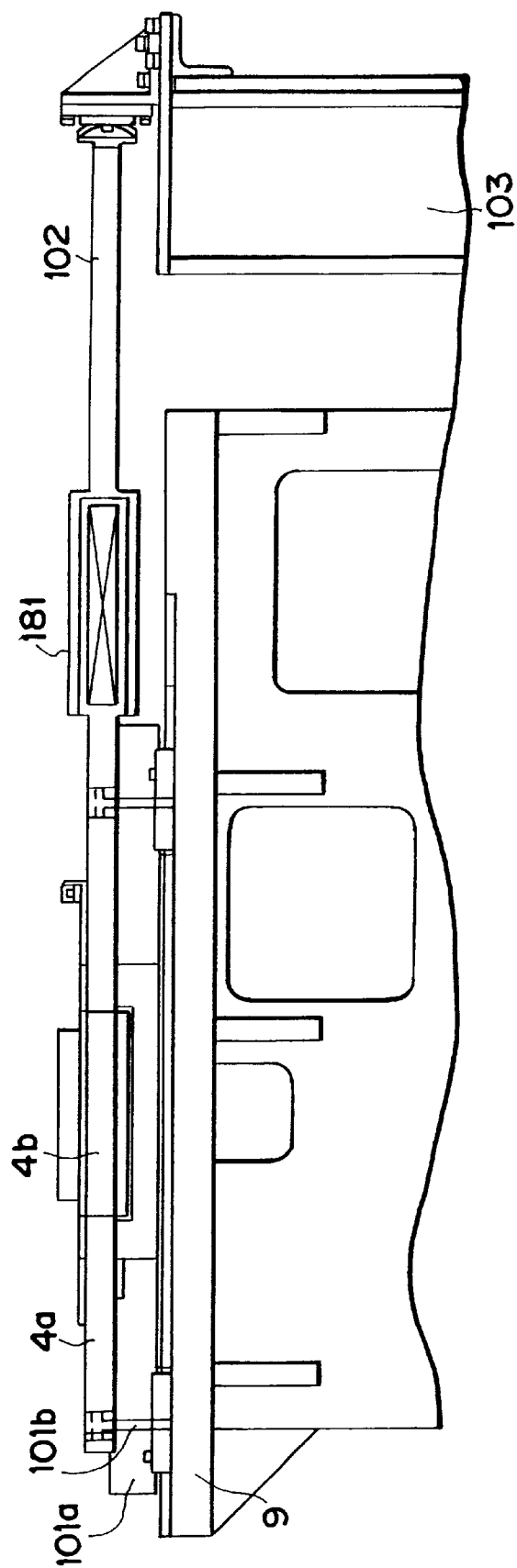
FIG. 18 is a side view showing another embodiment of an axial supporting member in the apparatus of FIG. 1.
Figure 19:
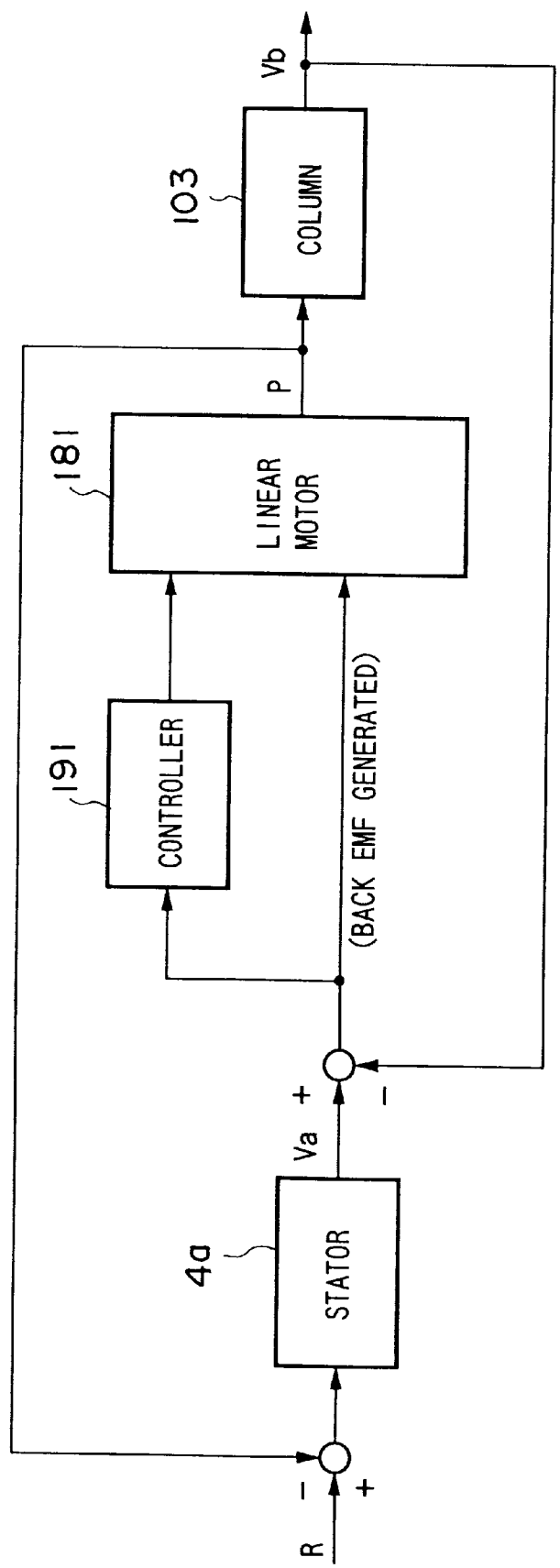
FIG. 19 is a block diagram showing an embodiment of an arrangement for controlling the drive of a linear motor in the axial supporting member of FIG. 18.
Figure 20:
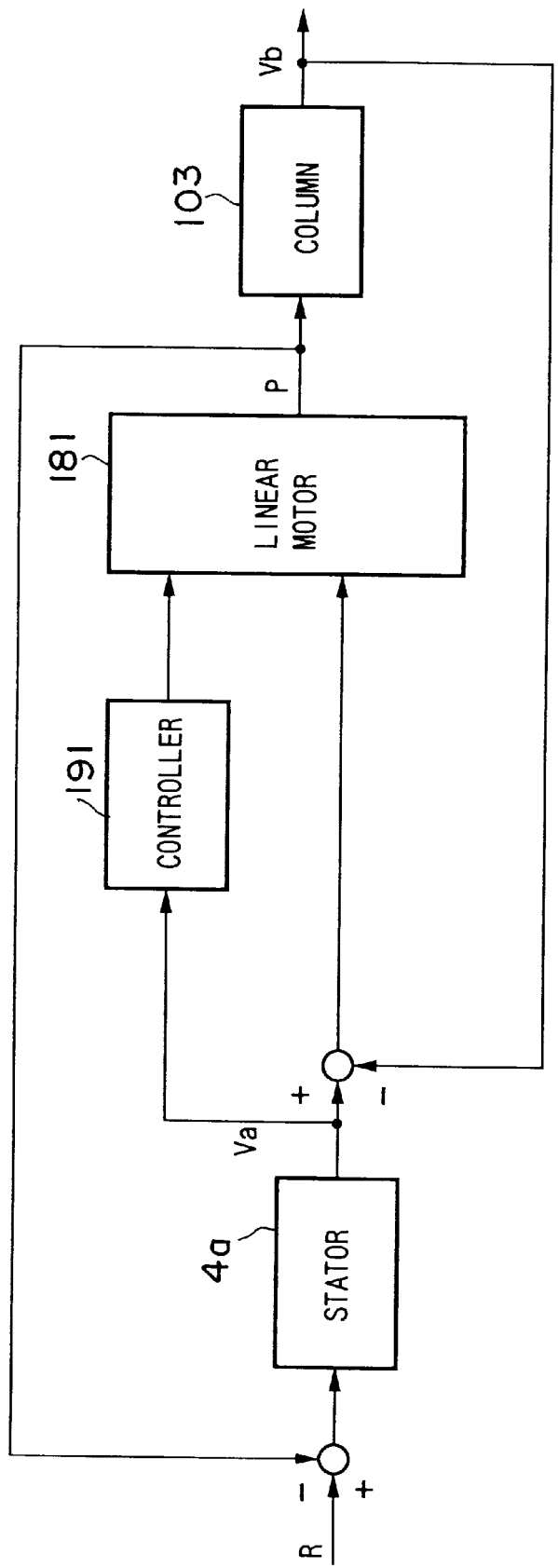
FIG. 20 is a block diagram showing another embodiment of an arrangement for controlling the drive of a linear motor in the axial supporting member of FIG. 18.
Figure 21:
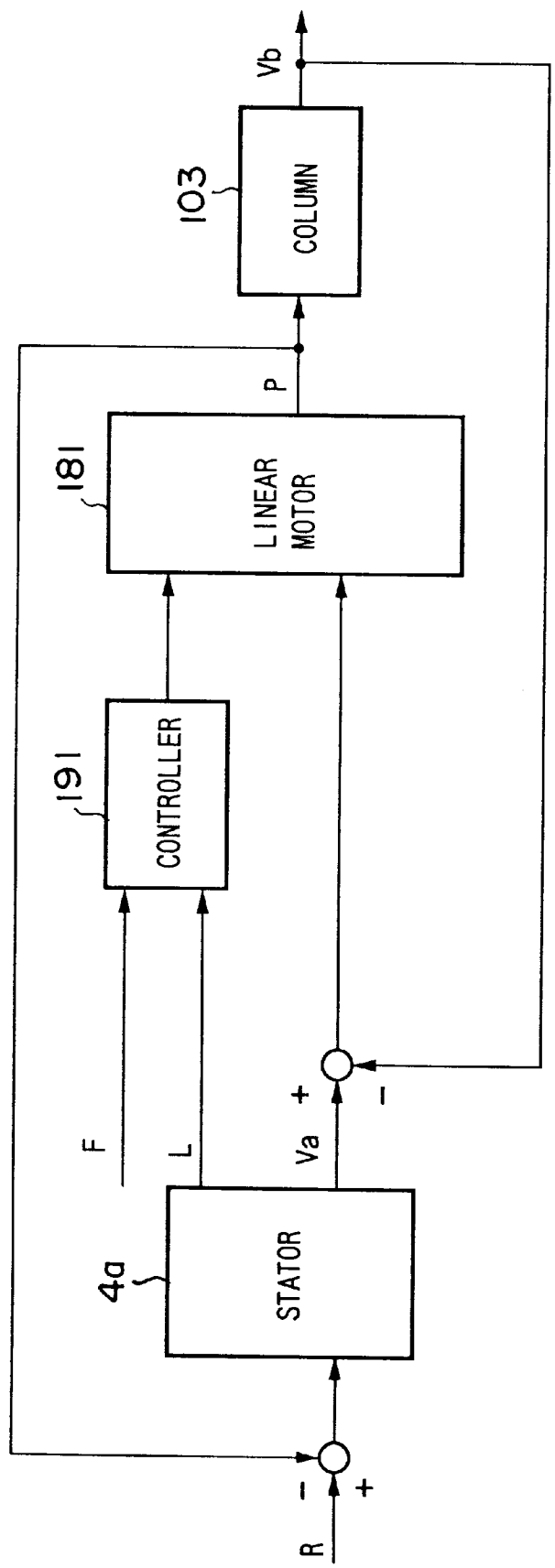
FIG. 21 is a block diagram showing another embodiment of an arrangement for controlling the drive of a linear motor in the axial supporting member of FIG. 18.

Yet another embodiment of the axial supporting member 102 will be described. As shown in FIG. 18, the axial supporting member 102 has a linear motor 181 having a coil side and a magnet side. The coil side is secured to the stator 4a and the magnet side is secured to the rod-shaped portion connected to the column 103. More specifically, it is so arranged that thrust in the Y direction (scanning direction) can be applied to the stator 4a by the linear motor 181. FIGS. 19 through 21 illustrate various arrangement for controlling the drive of the linear motor 181. As shown in these drawings, reaction force R and oppositely directed thrust P of the linear motor 181 act upon the stator 4a, which moves at a velocity Va in conformity with these forces. The thrust P of the linear motor 181 acts the column 102, which travels at a velocity Vb.

In the arrangement of FIG. 19, a signal representing the difference between the velocities Va and Vb enters a controller 191, which controls the driving of the linear motor 181. The linear motor 181 is controlled so as to null this difference. This makes it possible to improve the damping of the vibration of stator 4a. It should be noted that the difference between the velocities Va and Vb causes a commensurate back emf to be produced in the coil of the linear motor 181. Accordingly, the back emf developed by the coil may be used as the difference between the velocities Va and Vb.

In the arrangement of FIG. 20, a signal representing the velocity Va of the stator 4a, or a signal representing its position or acceleration, enters the controller 191. The latter controls the drive of the linear motor 181 in such a manner that the position of the stator 4a is displaced with respect to absolute space. In the arrangement of FIG. 21, the position L of the stator 4a enters the controller 191 as feedback and a predicted value F of thrust applied to the stator 4a enters the controller 191 as feed-forward. The controller 191 controls the drive of the linear motor 181 in such a manner that the displacement of the stator 4a becomes even smaller. As a result, the relative velocity between the stator 4a and the movable element 4b decreases. This reduces the back emf produced by the coil of the linear motor so that control error of the reticle stage 1 can be reduced.

A VCM motor which employs electromagnetic force in the same manner can be used instead of the linear motor 181. Means utilizing air pressure can also be used. As opposed to these non-contact arrangements, various actuators that rely upon contact can be used.

Figure 22:
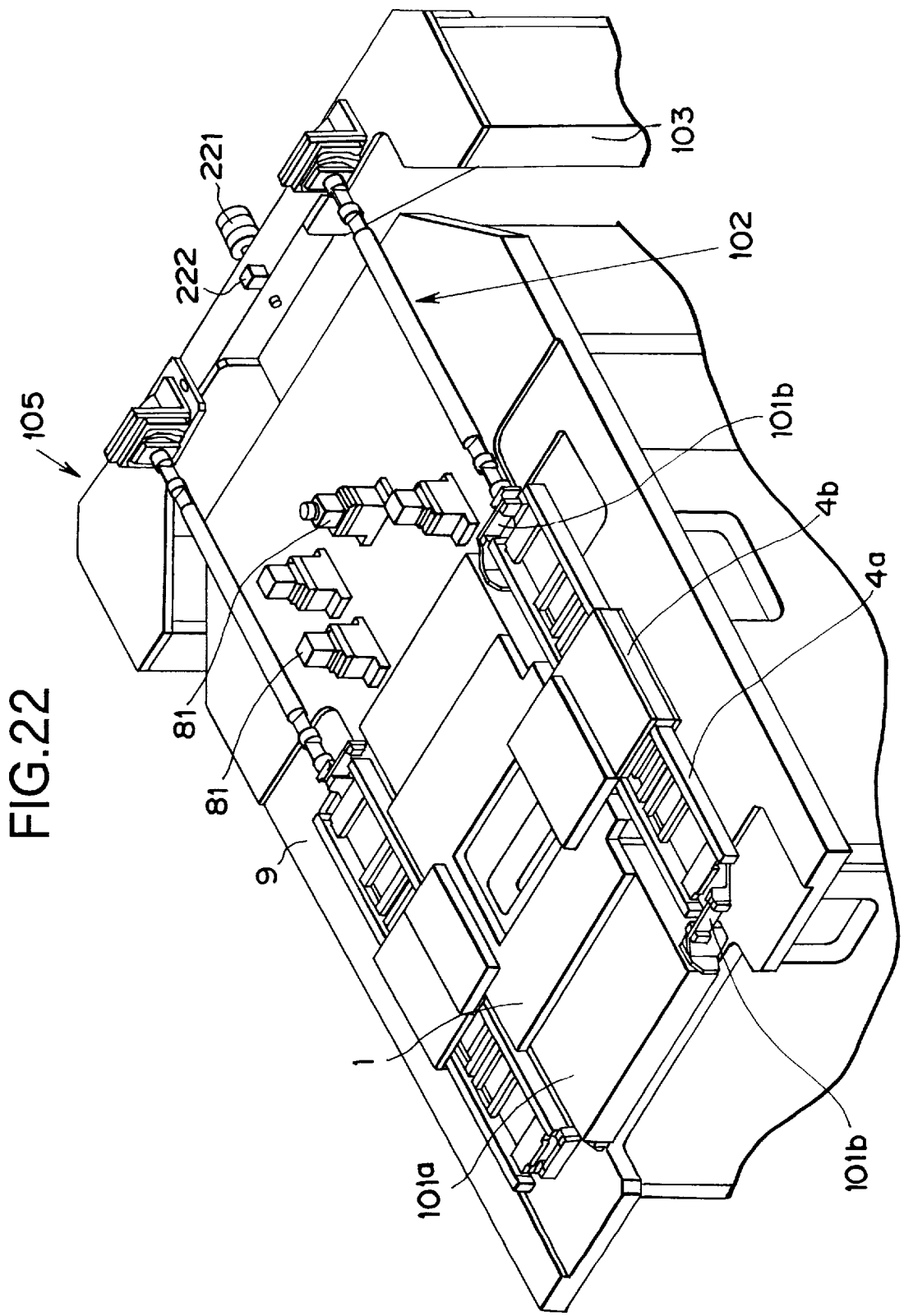
FIG. 22 is a perspective view showing another embodiment of the second supporting member in the apparatus of FIG. 1.
Figure 23:
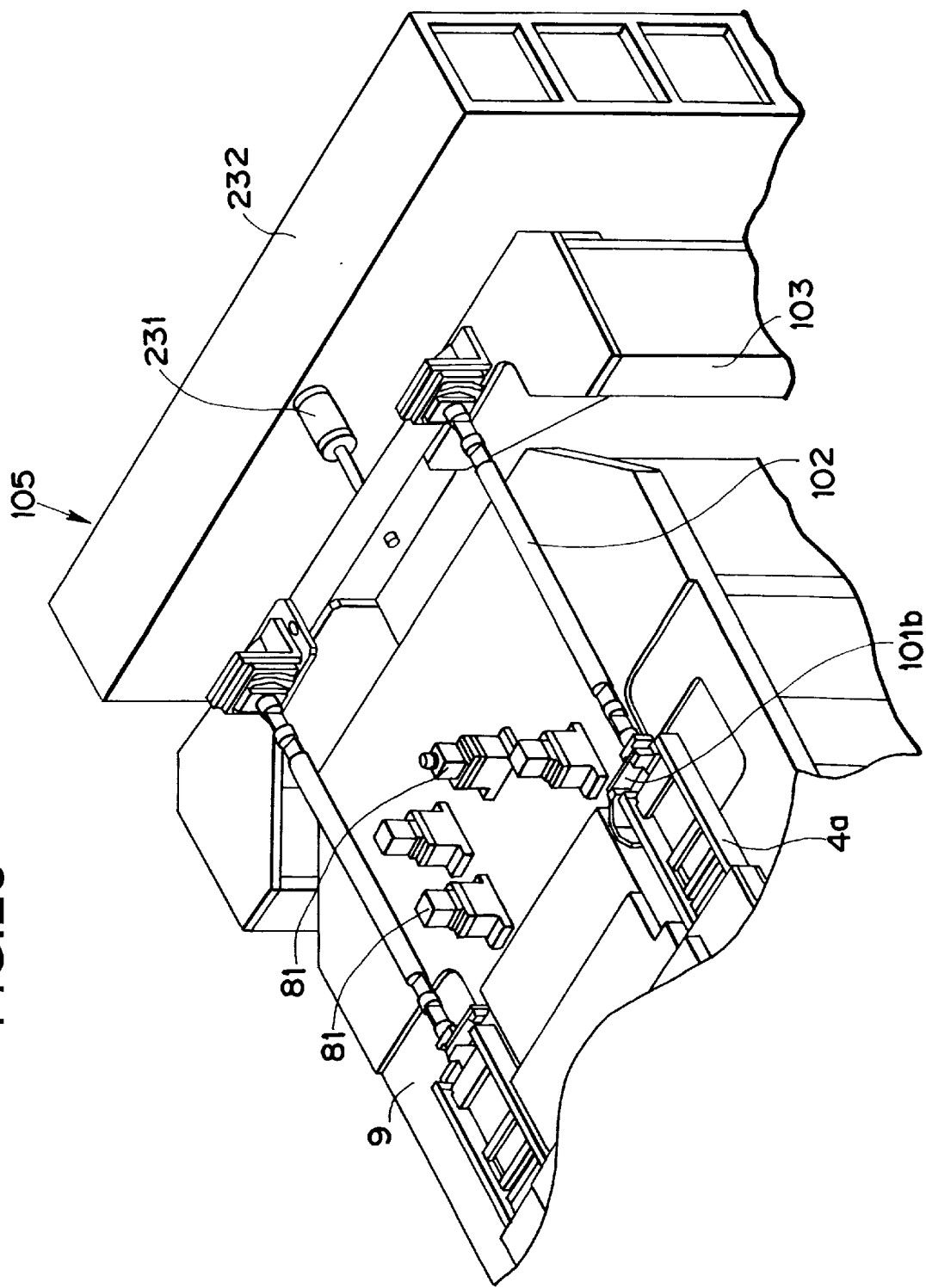
FIG. 23 is a perspective view showing another embodiment of the second supporting member in the apparatus of FIG. 1.

FIGS. 22 and 23 are perspective views showing other embodiments of the second supporting member 105. Here the second supporting member 105 has a damper for attenuating its vibration. In FIG. 22 the damper is an electromagnetic mass damper 221 attached to the upper end of the column 103. The electromagnetic damper 221 attenuates vibration of the column 103 in the Y direction by applying electromagnetic force to a mass so as to cancel the acceleration sensed by an accelerometer 222 mounted in the vicinity of the damper. An oil damper 231 is used in the arrangement of FIG. 23. The upper end of the column 103 is received, in the Y direction, by a support member 232 fixed to the floor, whereby the vibration of the column 103 in the Y direction is attenuated. Other examples of the damper include a resilient body or other material which received and absorbs reaction force.

In accordance with the arrangements described in connection with FIGS. 18 through 23, shock caused by the second supporting member 105 receiving the reaction force is attenuated so that overlay performance, performance of the projection image and throughput can be improved.

Figure 24:
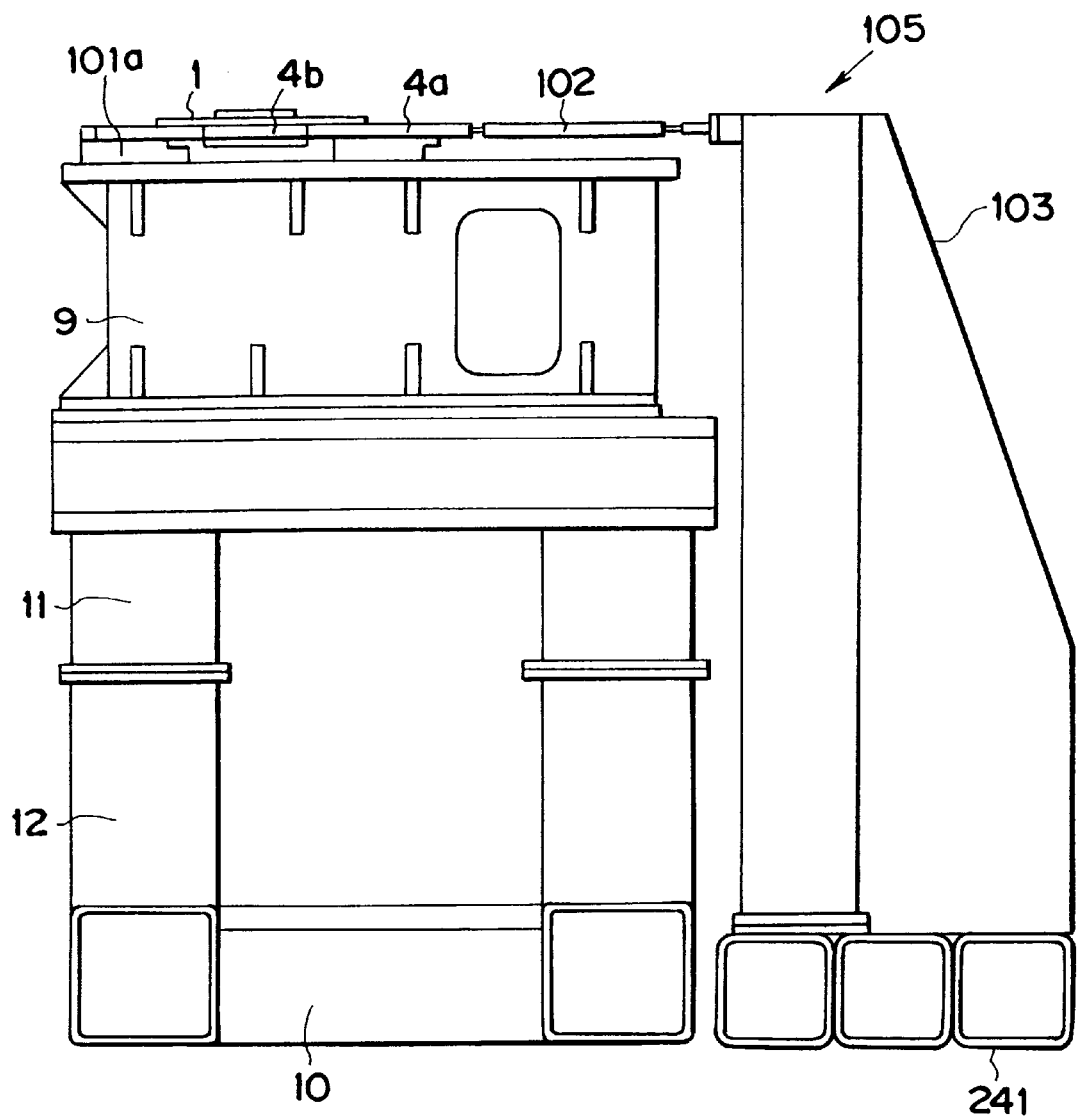
FIG. 24 is a side view showing yet another embodiment of the second supporting member in the apparatus of FIG. 1.

FIG. 24 is a side view showing yet another embodiment of the second supporting member 105. Here the total mass of the column 103 and lower portion 241 of the second supporting member 105 is greater than the total mass of the movable portion of the reticle stage 1 and movable element 4b, etc. Accordingly, the reaction force which acts upon the stator 4a can be absorbed satisfactorily via the axial supporting member 102 without that much displacement of the stator 4a.

Figure 25:
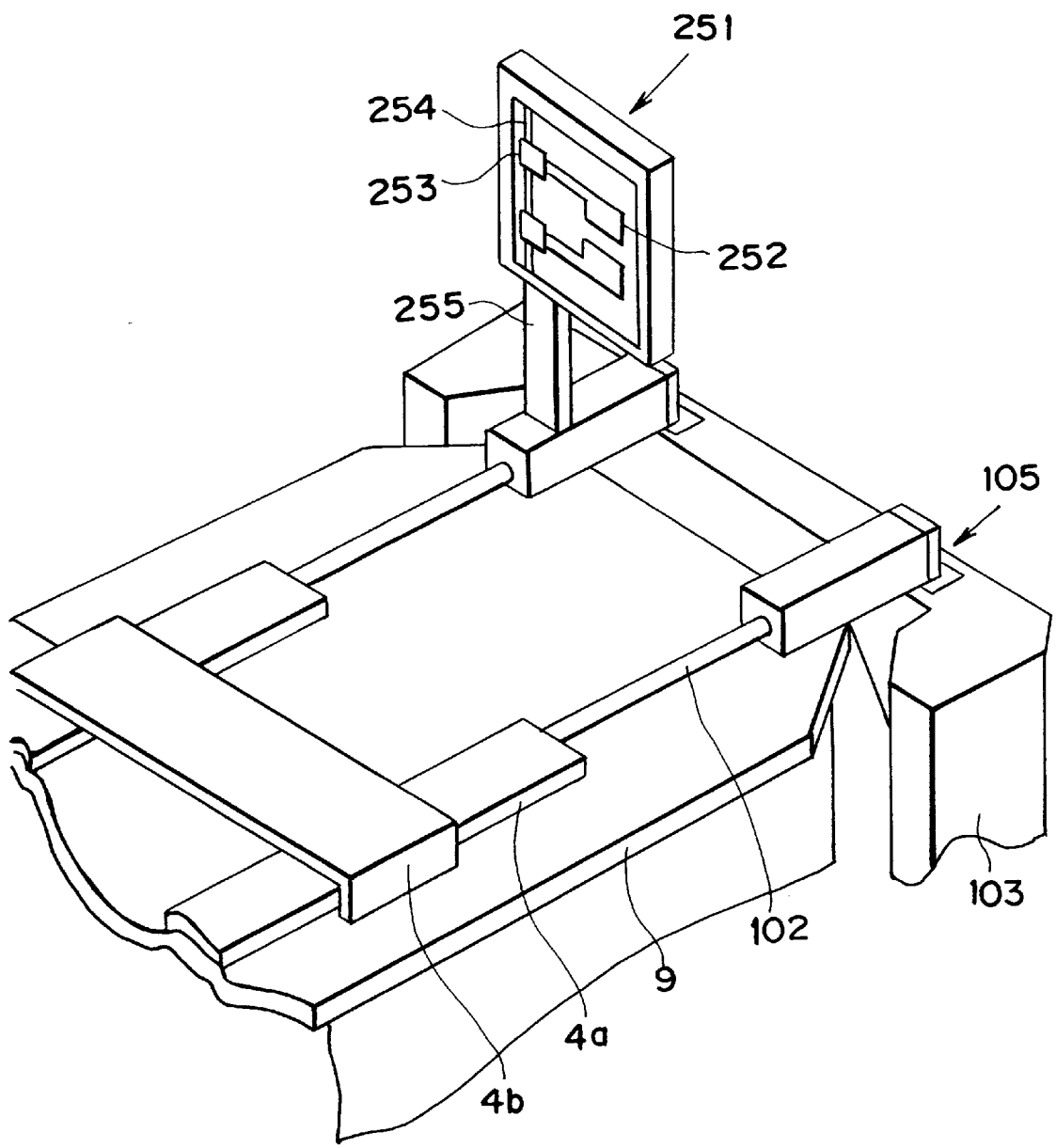
FIG. 25 is a diagram schematically showing an embodiment in which supporting means for a mask unit is joined to the second supporting member in the apparatus of FIG. 1.
Figure 26:
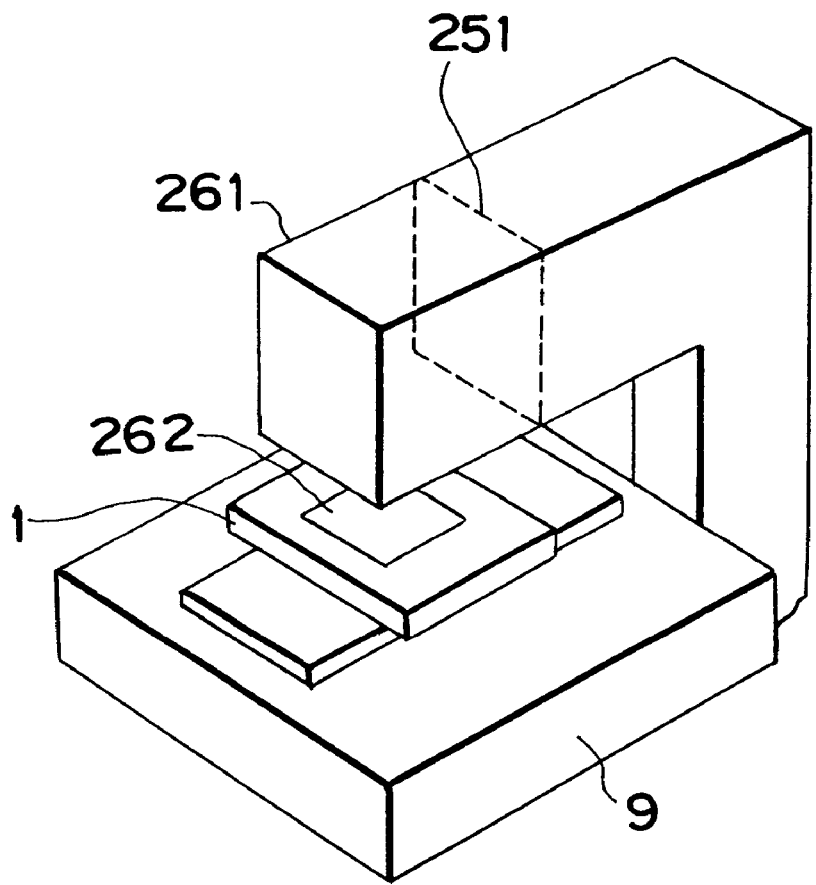
FIG. 26 is a schematic view showing the positional relationship between an illuminating optical system and the mask unit in the apparatus of FIG. 1.
Figure 26:
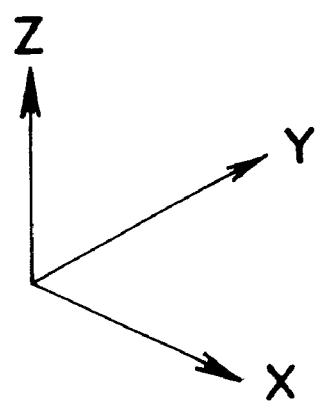

FIG. 25 is a diagram schematically showing a state in which the support member of a mask device is joined to the second supporting member 105. The illuminating optical system is not shown in FIG. 25. As shown schematically in FIG. 26, the mask device 251 is so adapted that exposure areas on a reticle 262 in the Y direction are suitably delineated by moving a masking plate 252 in the Z direction in conformity with movement of the reticle 262 at a position conjugate with the reticle 262 in an illuminating optical system 261. Accordingly, when scanning exposure is performed, it is required that the masking plate 252 be moved vertically (in the Z direction) to match movement for scanning the reticle 262. At this time a reaction force is produced in a stator 254 of a linear motor 253 that drives the plate 252. The reaction force is received by a reaction-force receiving pad 255, which is joined to the upper portion of the column 103 of the second supporting member 105. By virtue of this arrangement, reaction force that accompanies acceleration and deceleration of the masking plate 252 also can be received by the second supporting member 105 without being transmitted to the lens barrel table 9. Further, since the column 103 for accepting the reaction force also is utilized in common, space can be used efficiently.

Thus, in accordance with the above-mentioned stage, as described above, the stage is provided with a first supporting member for supporting the stationary portion with a degree of freedom in the direction of movement of the stage, and a second supporting member having an axial supporting member for supporting the stationary portion rigidly in the above-mentioned direction of movement and flexibly in other directions, the second supporting member being isolated from the first supporting member in such a manner that vibration will not be transmitted thereto. As a result, reaction force applied to the stationary portion can be prevented from being transmitted to the first supporting member. Accordingly, the stage can be fed highly precisely and at high speed without inducing a variety of characteristic vibrations that act upon movable portions and position measuring devices as vibratory external disturbance.

Further, the first and second supporting members are connected together and positional deviation between them is prevented. As a result, the positional relationship between the first and second supporting members can be maintained in excellent fashion.

The axial supporting member can be an elastic hinge such as a cross leaf-spring hinge or cylindrical spring hinge; a swivel link and a pre-loaded spring for applying pre-load to the link portion; a wire stretched in the direction of movement of the stage and means for clamping the wire; or an air pad acted upon by a force in the above-mentioned direction of movement, and a magnet for applying pre-load to the air pad in the direction of movement. As a result, reaction force applied to the stationary portion is absorbed with regard to the traveling direction of the stage and forces acting in other directions are allowed to escape. For example, strain due shifting can be absorbed even if the reticle side shifts with respect to the wafer side in the X direction.

Further, by supporting the stationary portion via a thrust applying portion which subjects the stationary portion to thrust in the traveling direction of the stage, better support can be provided. For example, by applying thrust to the stationary portion in such a manner that the relative velocity between the stationary portion and the second supporting member is reduced, vibration of the stationary portion can be attenuated in excellent fashion. Further, an arrangement may be adopted in which thrust is applied to the stationary portion so as to render the absolute position of the stationary portion constant based upon the velocity, position or acceleration of the stationary portion, or in which thrust is applied to the stationary portion so as to render the absolute position of the stationary portion constant based upon the position of the stationary portion and the predicted value of the thrust applied to the stationary portion. If the absolute position of the stationary portion is constant, the relative velocity between the stator and movable element can be reduced and the back emf produced in the coil can be decreased in a case where the stage driving device utilizes the electromagnetic force of a linear motor or the like. This makes it possible to reduce stage control error.

Further, by providing the second supporting member with an attenuating portion such as a damper or electromagnetic mass damper for attenuating its own vibration, shock due to the reaction force received by the second supporting member can be attenuated. By making the mass of the second supporting member greater than the mass of the movable portion, reaction force can be absorbed in excellent fashion without causing extreme displacement of the stator. As a consequence, the relative velocity between the stator and the movable element is made small to reduce the back emf produced in the coil so that stage control error can be reduced.

Further, by measuring the position of the movable portion using the position of the first supporting member, to which the reaction force of the stationary portion is not transmitted, as a reference, the position of the movable portion can be measured highly precisely when the stage is driven.

In a case where the stage is used for movement when a master plate is scanned in the scanning-type exposure-type exposure apparatus, the first supporting member is connected to the lens barrel table on which the projection optical system has been mounted, and the second supporting member is connected to the reaction-force receiving pad, the reaction force being produced when the masking plate of the mask unit is moved. As a result, the reaction force produced by the mask unit can be absorbed simultaneously without requiring that much space.

The above-described exposure apparatus has the above-mentioned stage device as the device for moving the master plate in order to perform scanning exposure, and the first supporting member thereof is connected to the lens barrel table on which the projecting optical system has been mounted. This makes it possible to prevent there action force of the driving force produced at the time of scanning exposure for being transmitted to the lens barrel table. Accordingly, vibration and deformation of the lens barrel table can be minimized so that overlay performance and performance of the exposed image can be improved without reducing throughput.

In accordance with the device manufacture method described above, the reaction force produced by the stationary portion of the stage is received by the second supporting member of the stage when the master plate is moved in the scanning direction using the exposure apparatus at the time of scanning exposure. This makes it possible to prevent the reaction force from being transmitted to the lens barrel table. Accordingly, vibration and deformation of the lens barrel table can be minimized so that overlay performance and performance of the exposed image can be improved without reducing throughput.

As many apparently widely different embodiments of the present invention can be made without departing from the spirit and scope thereof, it is to be understood that the invention is not limited to the specific embodiments thereof except as defined in the appended claims.

What is claimed is:

1. A stage apparatus comprising:

moving means, including a stationary portion and a movable portion, for applying thrust between said stationary and movable portions to thereby move said movable portion in a predetermined direction of movement;

first supporting means for supporting said stationary portion with a degree of freedom in the direction of movement;

axial supporting means for supporting said stationary portion rigidly in the direction of movement and flexibly in at least one of other directions; and second supporting means for supporting said axial supporting means, wherein said first supporting means is substantially isolated from said second supporting means with respect to transmission of vibration.

2. The apparatus according to claim 1, further comprising a leaf spring which connects said first and second supporting means for preventing a positional deviation between them.

3. The apparatus according to claim 1, wherein said axial supporting means is an elastic hinge.

4. The apparatus according to claim 3, wherein said elastic hinge is one of a cross leaf-spring hinge or a cylindrical spring hinge.

5. The apparatus according to claim 1, wherein said axial supporting means is constituted by a swivel link and a pre-loaded spring for applying a pre-load to said link.

6. The apparatus according to claim 1, wherein said axial supporting means has a wire stretched in the direction of movement and a member for clamping said wire.

7. The apparatus according to claim 1, wherein said axial supporting means has an air pad acted upon by a force in the direction of movement, and a magnet for applying a pre-load to said air pad in the direction of movement.

8. The apparatus according to claim 1, wherein said axial supporting means has thrust applying means for applying a thrust to said stationary portion in the direction of movement, said stationary portion being supported via said thrust applying means.

9. The apparatus according to claim 8, wherein said thrust applying means senses relative velocity between said stationary portion and said second supporting means and applies thrust to said stationary portion so as to reduce the relative velocity.

10. The apparatus according to claim 8, wherein said thrust applying means senses velocity, position or acceleration of said stationary portion and, on the basis thereof, applies thrust to said stationary portion in such a manner that the absolute position of said stationary portion is rendered constant.

11. The apparatus according to claim 8, wherein said thrust applying means senses the position of said stationary portion and applies thrust to said stationary portion, in such a manner that the absolute position of said stationary portion is rendered constant, based upon the sensed position and a predicted value of thrust applied to said stationary portion.

12. The apparatus according to claim 1, wherein said second supporting means has attenuating means for attenuating vibration of said second supporting means.

13. The apparatus according to claim 12, wherein said attenuating means is one of an air damper and an electromagnetic damper.

14. The apparatus according to claim 1, wherein said second supporting means has a mass larger than that of said movable portion.

15. The apparatus according to claim 1, further comprising measuring means for measuring a position of said movable portion using a position of said first supporting means as a reference.

16. The apparatus according to claim 1, wherein said moving means applies thrust between said stationary portion and said movable portion by a linear motor having a stator and a movable element, said stationary portion having the stator of said linear motor and said movable portion having the movable element of said linear motor.

17. The apparatus according to claim 8, wherein said thrust applying means is constituted by a linear motor.

18. The apparatus according to claim 1, wherein said first supporting means is provided on a table, which is supported through damper means, and said first supporting means is substantially isolated form said second supporting means by said damper means.

19. An exposure apparatus for exposing, by scanning, a substrate, by moving a master plate and the substrate with respect to a projecting optical system while projecting a portion of the master plate onto the substrate via the projecting optical system by illuminating light from an illuminating optical system, said apparatus comprising:

moving means, including a stationary portion and a movable portion, for applying thrust between the stationary portion and the movable portion, which carries the master plate, to thereby move the movable portion in a predetermined direction together with the master plate;

first supporting means for supporting said stationary portion with a degree of freedom in the direction of movement;

axial supporting means for supporting said stationary portion rigidly in the direction of movement and flexibly in at least one of other directions; and second supporting means for supporting said axial supporting means, wherein said first supporting means is substantially isolated from said second supporting means with respect to transmission of vibration, and said first supporting means is joined to a table on which the projecting optical system has been mounted.

20. The apparatus according to claim 19, further comprising mask means for moving a masking plate in conformity with movement of the master plate at a position in said illuminating optical system conjugate with the master plate, said second supporting means being joined to a member for receiving reaction force produced when the masking plate is moved by said mask means.

21. The apparatus according to claim 19, further comprising three strut members for supporting said table, said second supporting means having a bottom portion connected via resilient members to a lower portion of each of said three strut members rigidly in the horizontal direction and flexibly in the vertical direction, a columnar member extending upwardly from said bottom portion, and a connecting member extending from said columnar member in a direction of movement of said moving means and connected to said stationary portion and said axial supporting means being constituted by said connecting member.

22. The apparatus according to claim 21, further comprising:

a base frame joined to a lower portion of each of said three strut members; and elastic means interposed between said base frame and said bottom portion of the said second supporting means for applying a vertically directed elastic force to said bottom portion.

23. The apparatus according to claim 19, further comprising:

three strut members for supporting said table via dampers; and a base frame joined to a lower portion of each of said three strut members, said second supporting means having a column member extending upwardly from said base frame, and a connecting member extending from said column member in direction of movement of said moving means and connected to said stationary portion, said axial supporting means being constituted by said connecting member.

24. A method of manufacturing a device, comprising:

a supply step of supplying a substrate; and an exposure step of exposing, by scanning, the substrate, by moving a master plate and the substrate with respect to a projecting optical system while projecting a portion of the master plate onto the substrate via the projecting optical system by illuminating light from an illuminating optical system, said exposure step including the following steps, when scanning exposure is performed:

(i) moving a movable portion, which carries the substrate, in a prescribed direction of movement by applying thrust between the movable portion and a stationary portion; and (ii) absorbing a reaction force, which is produced by the stationary portion due to movement of the movable portion, by first supporting means for supporting the stationary portion with a degree of freedom in the direction of movement, axial supporting means for supporting the stationary portion rigidly in the direction of movement and flexibly in at least one of other directions, and second supporting means for supporting the axial supporting means, wherein the first supporting means is substantially isolated from the second supporting means with respect to transmission of vibration.

* * * * *

UNITED STATES PATENT AND TRADEMARK OFFICE
CERTIFICATE OF CORRECTION

PATENT NO. : 5,909,272

DATED : June 1, 1999

INVENTORS : EIJI OSANAI, ET AL.

It is certified that error appears in the above-identified patent and that said Letters Patent is hereby corrected as shown below:

COLUMN 6:

line 13, "o" should read --to--.

COLUMN 8:

line 46, "105" should read --105,--;
    line 47, "105," should read --105--; and
    line 48, "stage" should read --stage,--.

COLUMN 11:

line 45, "there action" should read --the reaction--.

COLUMN 13:

line 16, "form" should read --from--.

UNITED STATES PATENT AND TRADEMARK OFFICE
CERTIFICATE OF CORRECTION

PATENT NO. : 5,909,272

DATED : June 1, 1999

INVENTORS : EIJI OSANAI, ET AL.

Page 2 of 2

It is certified that error appears in the above-identified patent and that said Letters Patent is hereby corrected as shown below:

<u>COLUMN 14</u>:

line 4, "portion" should read --portion,--.

Signed and Sealed this

Twenty-third Day of November, 1999

*Attest:*

Q. TODD DICKINSON

*Attesting Officer*    *Acting Commissioner of Patents and Trademarks*